US008531747B2

(12) United States Patent
Matsubara et al.

(10) Patent No.: US 8,531,747 B2
(45) Date of Patent: Sep. 10, 2013

(54) HOLOGRAM, HOLOGRAM DATA GENERATION METHOD, AND EXPOSURE APPARATUS

(75) Inventors: Isao Matsubara, Tucson, AZ (US);
Yasuyuki Unno, Tucson, AZ (US);
William Dallas, Tucson, AZ (US)

(73) Assignee: Canon Kabushiki Kaisha, Tokyo (JP)

( * ) Notice: Subject to any disclaimer, the term of this patent is extended or adjusted under 35 U.S.C. 154(b) by 1060 days.

(21) Appl. No.: 12/491,094

(22) Filed: Jun. 24, 2009

(65) Prior Publication Data

US 2010/0328742 A1 Dec. 30, 2010

(51) Int. Cl.
*G02B 5/32* (2006.01)
*G03B 27/54* (2006.01)
*G03H 1/00* (2006.01)
*G03H 1/08* (2006.01)

(52) U.S. Cl.
USPC .................. 359/15; 359/1; 359/9; 355/67

(58) Field of Classification Search
USPC .................. 359/1, 9, 15, 21, 32; 355/67–71; 250/492.1–492.2, 492.22, 548
See application file for complete search history.

(56) References Cited

U.S. PATENT DOCUMENTS

| 3,781,084 | A | * | 12/1973 | Fukuhara | 359/251 |
| 7,009,686 | B2 | | 3/2006 | Kawashima et al. | |
| 7,126,673 | B2 | | 10/2006 | Mori | |
| 7,265,816 | B2 | * | 9/2007 | Tsuji | 355/71 |
| 8,072,661 | B2 | * | 12/2011 | Matsubara | 359/15 |
| 8,189,248 | B2 | * | 5/2012 | Matsubara | 359/3 |
| 2002/0192566 | A1 | * | 12/2002 | Elliott et al. | 430/1 |
| 2006/0028957 | A1 | | 2/2006 | Kim | |
| 2009/0002787 | A1 | * | 1/2009 | Cable et al. | 359/9 |
| 2009/0034036 | A1 | * | 2/2009 | Matsubara | 359/9 |

FOREIGN PATENT DOCUMENTS

| EP | 1610181 A | 12/2005 |
| JP | 6-053120 A | 2/1994 |
| JP | 2006-49902 | 2/2006 |
| JP | 2006-196715 A | 7/2006 |
| JP | 2008-544307 A | 12/2008 |
| JP | 2009-036916 A | 2/2009 |

(Continued)

OTHER PUBLICATIONS

J.R. Fienup, "Itertative method applied to image reconstruction and to computer-generated holograms", Optical Engineering 19(3), pp. 297-305, May/Jun. 1980.

(Continued)

*Primary Examiner* — Tony Ko
*Assistant Examiner* — Jori S Reilly-Diakun
(74) *Attorney, Agent, or Firm* — Canon USA Inc IP Division

(57) ABSTRACT

The present invention provides a hologram which forms a light intensity distribution on a predetermined plane by using an incident light. The hologram includes a plurality of cells configured to control both a phase of a first polarized light component of the incident light and a phase of a second polarized light component. The plurality of cells are designed to form a portion in an overlap region in which a first light intensity distribution region formed on the predetermined plane by the first polarized light component and a second light intensity distribution region formed on the predetermined plane by the second polarized light component are superposed on each other. The phase of the first polarized light component is diffused in the portion formed in the overlap region.

16 Claims, 46 Drawing Sheets

(56) References Cited

FOREIGN PATENT DOCUMENTS

| KR | 10-2002-0064937 A | 8/2002 |
|---|---|---|
| KR | 10-2009-0013133 A | 2/2009 |
| WO | 2009-084409 A1 | 7/2009 |
| WO | 2009-084466 A1 | 7/2009 |

OTHER PUBLICATIONS

Jens Hossfeld et al., "Polarizing computer-generated holograms", Optical Engineering 32(8), pp. 1835-1837, Aug. 1993.

Fang Xu et al., "Polarization-selective computer-generated holograms: Design, fabrication and applications", Applied Optics 34(2), pp. 256-266, Jan. 10, 1995.

Wanji Yu et al., "Polarization-multiplexed diffractive optical elements fabricated by subwavelength structures", Applied Optics 41(1), pp. 96-100, Jan. 1, 2002.

S.H. Tao et al., "Optimized polarization-selective computer-generated hologram with fewer phase combinations", Optics Express 11(11), pp. 1252-1257, Jun. 2, 2003.

\* cited by examiner

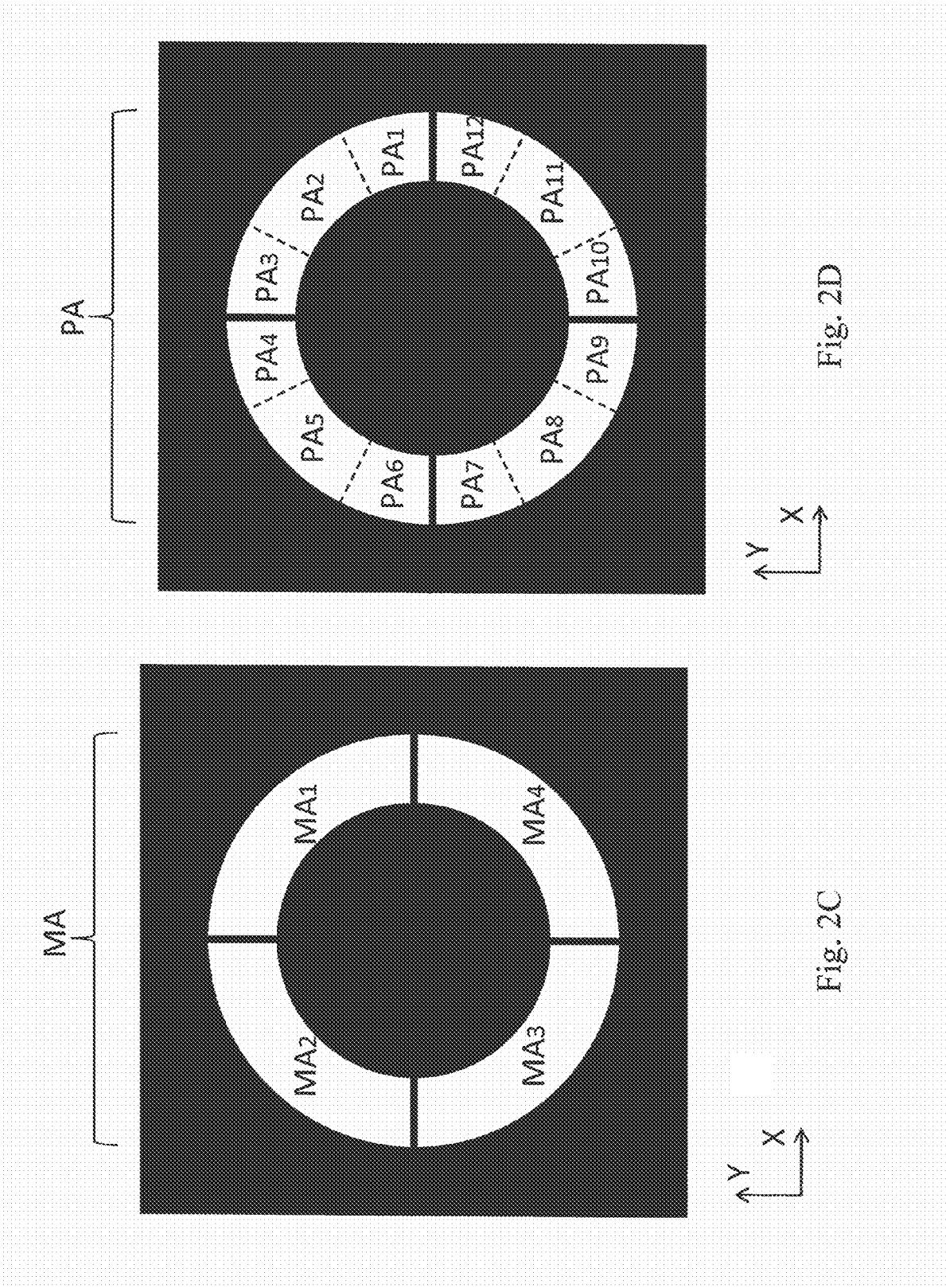

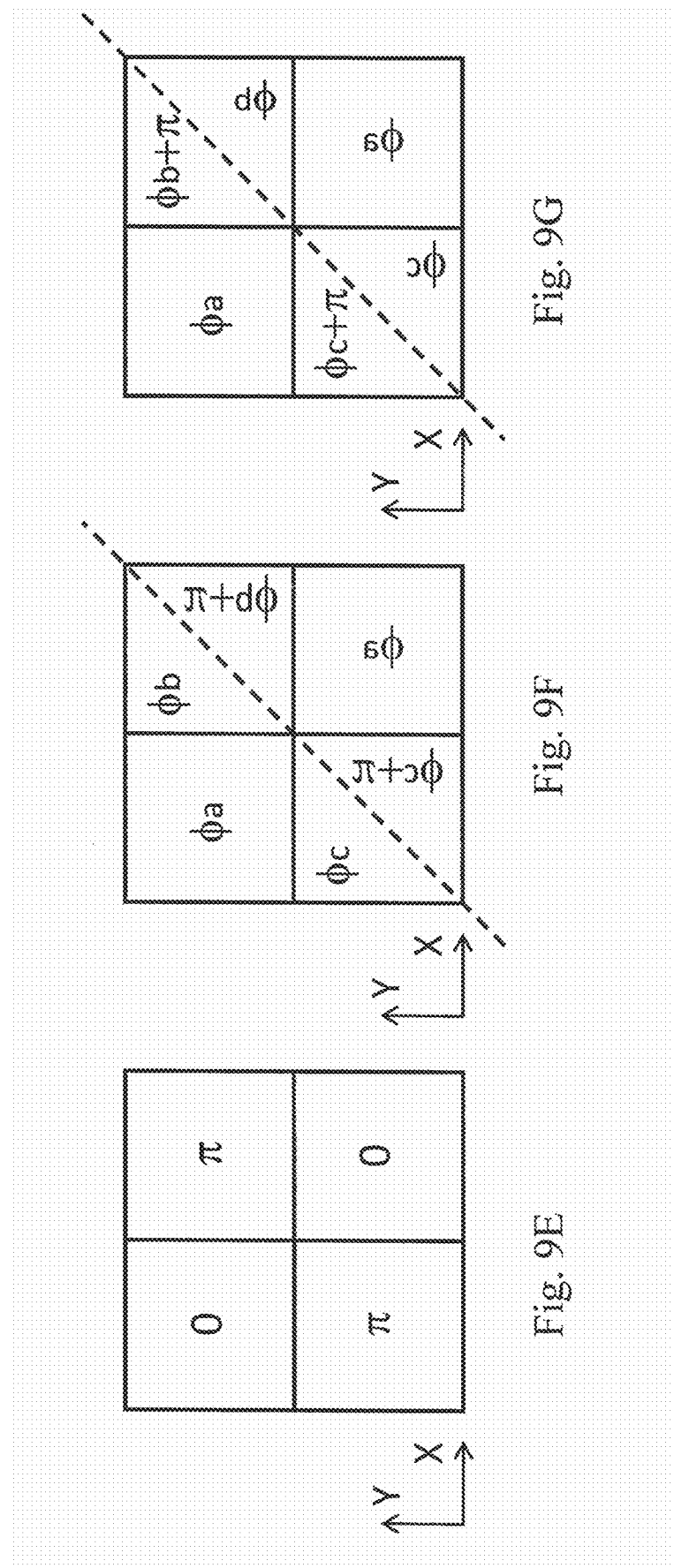

| $0$ | $\pi$ |
|---|---|
| $\pi$ | $0$ |

Fig. 10E

| $\phi a + \pi$ | $\phi a$ |
|---|---|
| $\phi a$ | $\phi a + \pi$ |

Fig. 10F

| $\phi a + \pi$ | $\phi a$ |
|---|---|
| $\phi a + \pi$ | $\phi a$ |

Fig. 10G

HOLOGRAM, HOLOGRAM DATA GENERATION METHOD, AND EXPOSURE APPARATUS

BACKGROUND OF THE INVENTION

1. Field of the Invention

The present invention relates to a hologram, a hologram data generation method, and an exposure apparatus.

2. Description of the Related Art

A projection exposure apparatus has conventionally been employed to fabricate a micro-patterned semiconductor device such as a semiconductor memory or a logic circuit by using photolithography (printing). The projection exposure apparatus projects and transfers a circuit pattern formed on a reticle (mask) onto a substrate such as a wafer via a projection optical system.

A resolution R of the projection exposure apparatus is given by:

$$R = k_1 \times \frac{\lambda}{NA} \quad (1)$$

where $\lambda$ is the exposure light wavelength, NA is the numerical aperture of the projection optical system, and $k_1$ is a process constant determined by, for example, a development process.

The shorter the exposure light wavelength or the higher the NA of the projection optical system, the better the resolution. However, it might be difficult to further shorten the current exposure light wavelength because the transmittance of a glass material generally decreases as the exposure light wavelength shortens. It might be also difficult to further increase the NA of the projection optical system available at present because the depth of focus decreases in inverse proportion to the square of the NA of the projection optical system, and because it might be difficult to design and manufacture lenses to form a high-NA projection optical system.

Under the circumstances, there have been proposed resolution enhanced technologies (RETs) of improving the resolution by decreasing the process constant $k_1$. One of these RETs is the so-called modified illumination method (or oblique illumination method).

The modified illumination method generally inserts an aperture stop, which has a light-shielding plate on the optical axis of an optical system, in the vicinity of the exit surface of an optical integrator which forms a uniform surface light source, thereby obliquely irradiating a reticle with exposure light.

The modified illumination method includes, for example, an annular illumination method and quadrupole illumination method that are different in the aperture shape of an aperture stop (i.e., the shape of the light intensity distribution). There has also been proposed another modified illumination method which uses a computer generated hologram (CGH) in place of an aperture stop, in order to improve the use efficiency (illumination efficiency) of the exposure light.

Along with an increase in the NA of the projection optical system, a polarized illumination method which controls the polarization state of exposure light is also required to increase the resolution of the projection exposure apparatus. The polarized illumination method illuminates a reticle with, for example, S-polarized light alone, which has a component in the circumferential direction of concentric circles about the optical axis. A contrast of the image to be formed might be enhanced by using the S-polarized light alone.

In recent years, there has been proposed a technique which exploits both the modified illumination method (the formation of a light intensity distribution having a desired shape, e.g., a quadrupolar shape) and the polarized illumination method (i.e., polarization state control).

For example, Japanese Patent Laid-Open No. 2006-196715 discloses a technique which implements both the modified illumination method and polarized illumination method using a light beam conversion element composed of a plurality of pairs of a form birefringence region and a diffraction region. Japanese Patent Laid-Open No. 2006-196715 describes controlling the polarization state using the form birefringence region and the shape (i.e., a reconstructed image) of the light intensity distribution at the predetermined plane using the diffraction region. The number of the pairs depends on kinds of polarization states formed on the predetermined plane.

U.S. Pat. No. 7,265,816 (or Japanese Patent Laid-Open No. 2006-5319) discloses a technique which can control the balance among four poles of a quadrupolar light intensity distribution typically formed by the modified illumination method and the polarized illumination method. U.S. Pat. No. 7,265,816 refers, after converting four circularly polarized lights into four linearly polarized lights different from each other with a quarter wave plate, to change the light intensity distribution at a predetermined plane by controlling the balance with using four separated CGHs which function as a diffractive optical element corresponding to each linearly polarized light.

A CGH design technique is disclosed in "Iterative method applied to image reconstruction and to computer-generated holograms", OPTICAL ENGINEERING, Vol. 19, No. 3, May/June 1980, 297-305.

The conventional technique requires a plurality of the separated CGHs to form a reconstructed image composed of a plurality of polarization states, and the number of separated CGHs to be required depends on the number of a variety of polarization states.

When a plurality of CGHs combined with each other are used, an irradiance variation might occur in a reconstructed image if an optical integrator cannot sufficiently correct the intensity distribution of the incident light (for example, if the light impinges on only some of these CGHs).

SUMMARY OF THE INVENTION

The present invention provides a hologram which can reduce the irradiance variation.

According to an aspect of the present invention, a hologram which forms a light intensity distribution on a predetermined plane by using an incident light is provided. The hologram includes a plurality of cells configured to control both a phase of a first polarized light component, in a first polarization direction, of the incident light and a phase of a second polarized light component in a second polarization direction perpendicular to the first polarization direction. The plurality of cells are designed to form a portion, in an overlap region in which a first light intensity distribution region formed on the predetermined plane by the first polarized light component and a second light intensity distribution region formed on the predetermined plane by the second polarized light component are superposed on each other, having a polarization state different from the first and second polarized light components. A phase difference between the phase of the first polarized light component and the phase of the second polarized light component is a constant value in the portion, and the phase of the first polarized light component is diffused in the portion.

Further features of the present invention will become apparent from the following description of exemplary embodiments with reference to the attached drawings.

BRIEF DESCRIPTION OF THE DRAWINGS

FIG. 2C illustrates an overlap region.
FIG. 2D illustrates a portion in the overlap region.
FIGS. 9D and 9E illustrate phase differences between X and Y-polarizations on the predetermined plane.
FIGS. 9F and 9G illustrate phase symmetries on the predetermined plane.

FIGS. 10D and 10E illustrate phase differences between X and Y-polarizations on the predetermined plane.
FIGS. 10F and 10G illustrate phase symmetries on the predetermined plane.

DESCRIPTION OF THE EMBODIMENTS

Figure 1A:
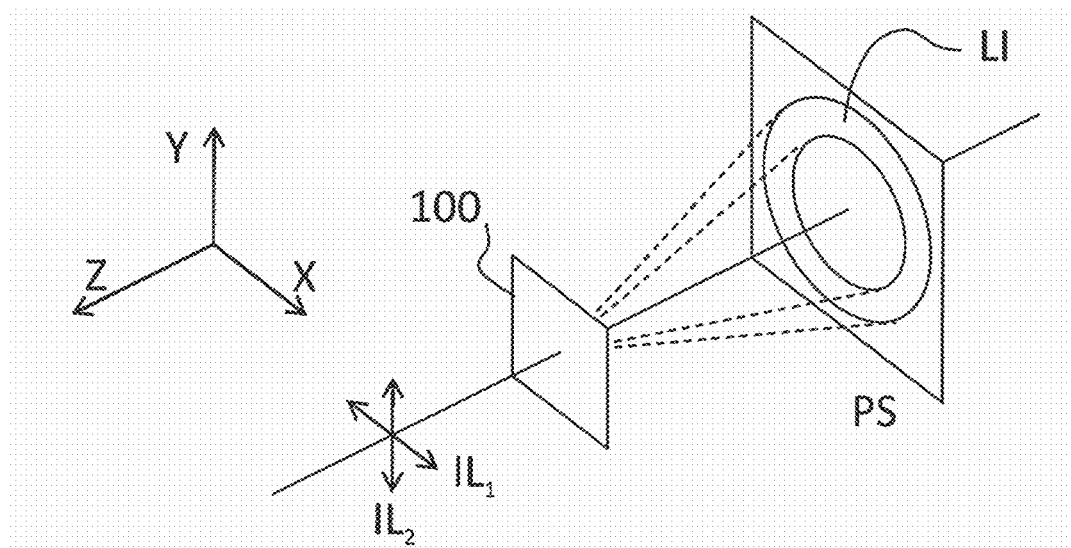
FIG. 1A illustrates a hologram.

Exemplary embodiments according to the present invention will be described below with reference to the attached drawings. The same reference numerals denote the same members throughout the drawings, and a repetitive description thereof will not be given.

FIG. 1A illustrates a hologram 100. The hologram 100 is, for example, a computer generated hologram.

As shown in FIG. 1A, the hologram 100 forms a light intensity distribution (i.e., reconstructed image) LI on a predetermined plane PS, for example, located at an aperture position of an illumination system for a lithography tool, by modulating a phase distribution of the wavefront of the incident light. A shape of the light intensity distribution LI is not limited to the shape illustrated in FIG. 1A.

The hologram 100 controls a phase of a first polarized light component (e.g., a first linearly polarized light component $IL_1$), in a first polarization direction (e.g., X-polarization), of an incident light. The first linearly polarized light component $IL_1$ forms a first light intensity distribution region on the predetermined plane PS.

The hologram 100 also controls a phase of a second polarized light component (e.g., a second linearly polarized light component $IL_2$), in a second polarization direction (e.g., Y-polarization) perpendicular to the first polarization direction. The second linearly polarized light component $IL_2$ forms a second light intensity distribution region on the predetermined plane PS.

Figure 1B:
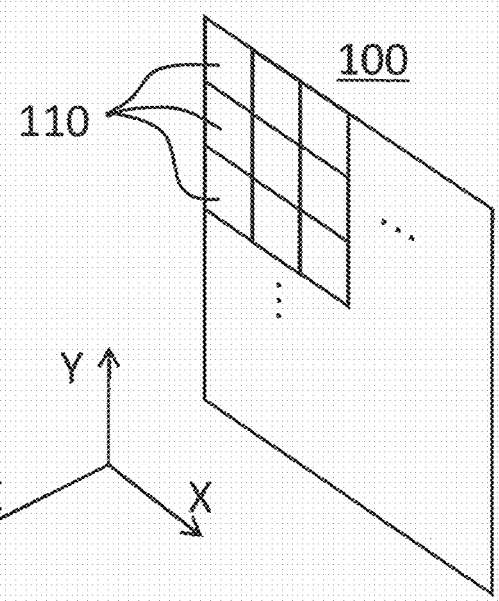
FIG. 1B illustrates a plurality of cells of the hologram.

The hologram 100 includes a plurality of cells 110 (e.g., a collection of cells 110) as shown in FIG. 1B to control phases of the first and second linearly polarized light components.

The plurality of cells might be designed so that there is an overlap region in which the first light intensity distribution region formed on the predetermined plane PS and the second light intensity distribution region formed on the predetermined plane PS are superposed on each other.

Figure 2B:
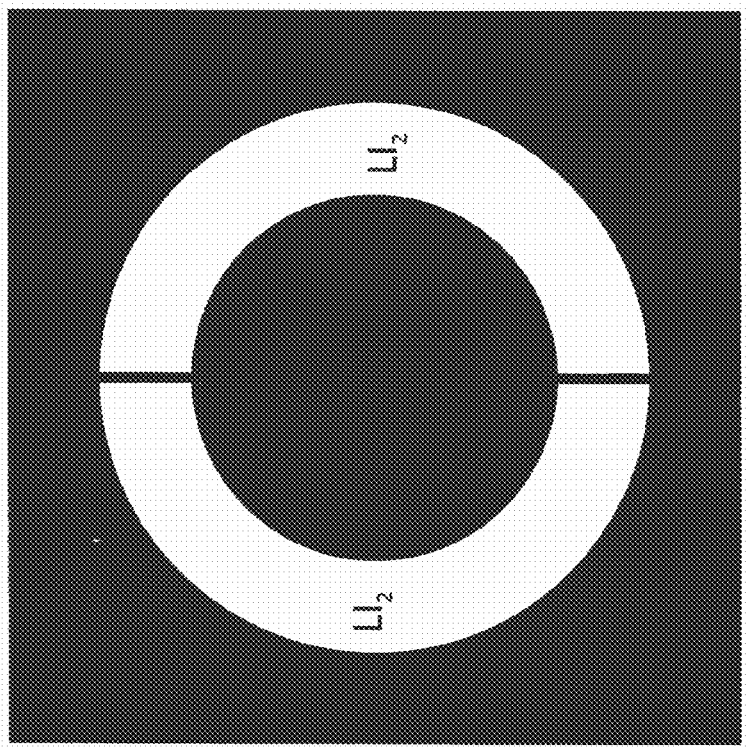
FIG. 2B illustrates a second light intensity distribution region.
Figure 2A:
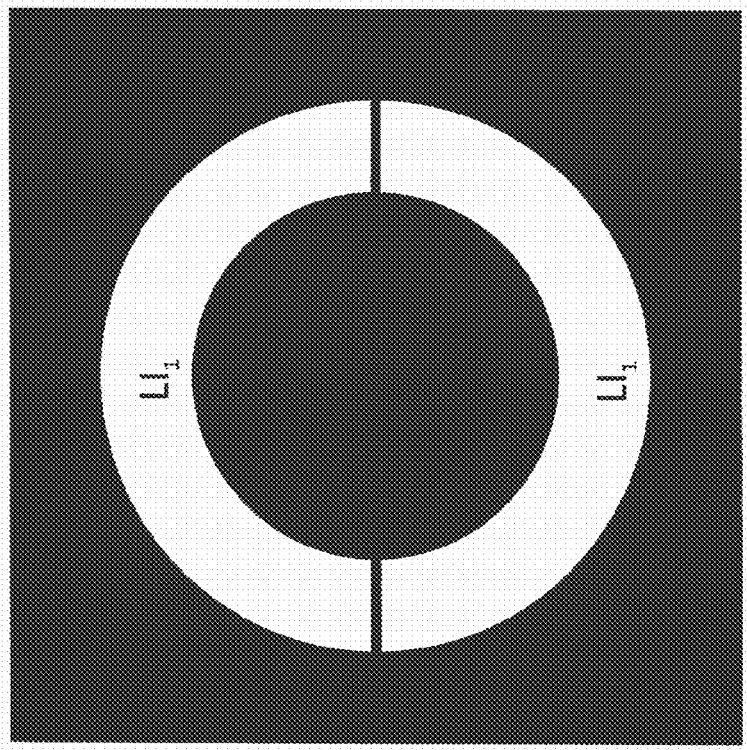
FIG. 2A illustrates a first light intensity distribution region.

For example, when the first linearly polarized light component $IL_1$ forms the first light intensity distribution region $LI_1$ as shown in FIG. 2A, and the second linearly polarized light component $IL_2$ forms the second light intensity distribution region $LI_2$ as shown in FIG. 2B, an overlap region MA is shown in FIG. 2C. Hereinafter, for ease of reference, MA1, MA2, MA3, and MA4 are referred to as a first, second, third, and fifth quadrant, respectively.

The plurality of cells 110 might be designed so that a portion PA is formed in the overlap region MA. In FIG. 2D, an overlap region MA1 is divided into three portions of PA1, PA2, and PA3 in light of a polarization state. And an overlap region MA2 is divided into PA4, PA5, and PA6, an overlap region MA3 is divided into PA7, PA8, and PA9, and an overlap region MA4 is divided into PA10, PA11, and PA12. And at least one of the portions from PA1 to PA12 shown in FIG. 2D has a polarization state different from the first and second linearly polarized light components. It is possible that all of the portions in the overlap region MA have polarization states different from the first and second linearly polarized light components.

A phase difference between the first linearly polarized light component and the second linearly polarized light component in each portion (e.g., PA1) might be a constant value. A value of the phase difference in each portion might be similar to or different from each other. The value of the phase difference can be selected from, but is not limited to, $-\pi/2$, $0$, $\pi/2$, $\pi$, $\pi/4$, $-\pi/4$, $3\pi/4$, and $-3\pi/4$.

The plurality of cells 110 might be designed to form such portions in the overlap regions (e.g., MA1). A phase difference between the phase of the first linearly polarized light component and the phase of second linearly polarized light component might be a constant value in the each portion. It is possible that the phase difference of each of the portions adjacent to each other might be different from or similar to each other.

The phase of the first linearly polarized light component is diffused in the portion (e.g., PA1). The diffused phase means that a phase distribution on the predetermined plane PS has a random phase. In other words, the diffused phase means that the phase distribution has a plurality of spatial frequencies. Regarding a reconstructed image, the phase distribution having the plurality of spatial frequencies means that the reconstructed image is formed by a light emitted from every point of the hologram. When the phase difference between the phase of the first polarized light component and the phase of second polarized light component is a constant value in a portion, if the phase of the first polarized light component is diffused in the portion, the phase of the second polarized light component is also diffused in the portion.

To form a polarization state different from the first and second linearly polarized light components in the portion, the hologram 100 might be designed in consideration of a phase difference between the first and second linearly polarized light components on the predetermined plane PS, or amplitude ratio (intensity rate) between the first and second linearly polarized light components on the predetermined plane PS, or both.

For example, when an incident light is a linearly polarized light in a polarization direction of +45° with respect to an X-axis, the polarization direction of the linearly polarized light is changed in a range from more than 0° to less than +90° with respect to an X-axis by controlling the amplitude ratio (the intensity rate). And also, the polarization direction of the linearly polarized light is changed in a range from less than 0° to more than −90° with respect to an X-axis by giving the phase difference of $\pi$ and controlling the amplitude.

When an incident light is a linearly polarized light in a polarization direction of +45° with respect to an X-axis, the polarization direction of the linearly polarized light is converted into a circularly polarized light by giving the phase difference of $\pi/2$ or $-\pi/2$ between the first and second linearly polarized light components on the predetermined plane PS.

Figure 2E:
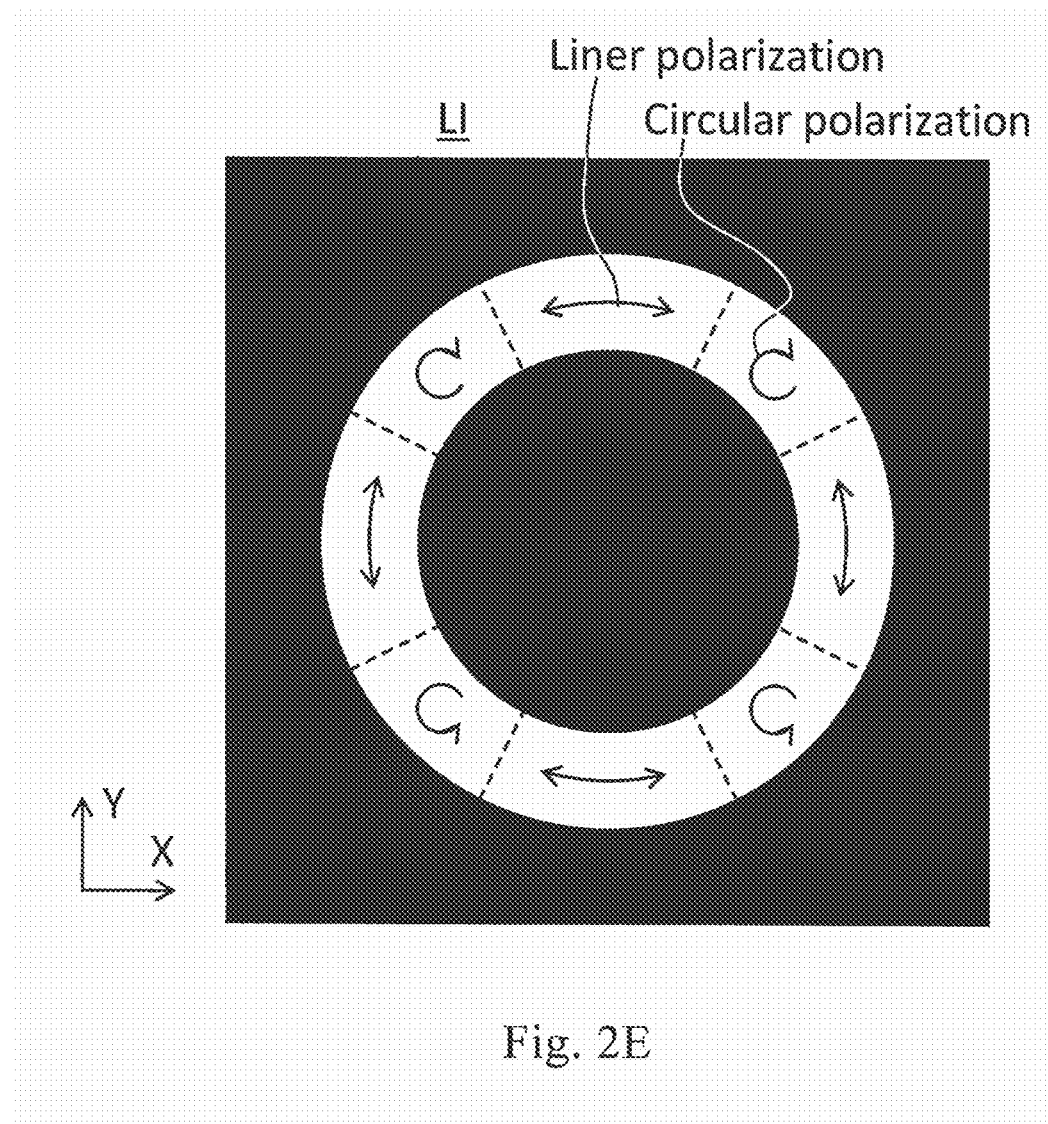
FIG. 2E illustrates an exemplary target image.

FIG. 2E shows an example of the light intensity distribution LI as explained in an example 1. Each polarization state on the predetermined plane PS is indicated by an arrow in FIG. 2E.

Shapes of the first light intensity distribution region $LI_1$ shown in FIG. 2A and the second light intensity distribution $LI_2$ shown in FIG. 2B is changed according to the light intensity distribution LI. Polarization states of portions PA1 to PA12 in the overlap region MA isn't limited to the disclosed types as shown in FIG. 2E, and might also be changed.

A data generation method used to manufacture a computer generated hologram 100 is described next.

First, a desired light intensity distribution LI on the predetermined plane PS in FIG. 1 is divided into a first light (e.g., X-polarization) intensity distribution region $LI_1$ formed by a first linearly polarized light component and a second light (e.g., Y-polarization) intensity distribution region $LI_2$ formed by a second linearly polarized light component perpendicular to the first linearly polarized light component.

Second, a phase difference between a phase of the first linearly polarized light component in the first light intensity distribution region $LI_1$ and a phase of the second linearly polarized light component in the second light intensity distribution region $LI_2$. The phase difference is determined in accordance with a relationship between a polarization direction of the incident light and a polarization state of the light intensity distribution LI to be formed on the predetermined plane PS so that a portion which has a designed polarization state is formed in the overlap region MA.

Third, a first hologram data to form the first light intensity distribution region $LI_1$ and a second hologram data to form the second light intensity distribution region $LI_2$ is generated under an admissibility condition of diffusing the phase of the first linearly polarized light component (e.g., X-polarization) while maintaining the phase difference which is determined. The first and second hologram data can be called as a hologram data for X and Y-polarizations. When a phase distribution of the first linearly polarized light component on the predetermined plane PS is diffused under maintaining the phase difference, a phase distribution of the second linearly polarized light component on the predetermined plane PS is also diffused. The phase of the first linearly polarized light component might be diffused in the first light intensity distribution region $LI_1$ entirely, and a diffused area might be optionally limited to the overlap region MA.

Finally, the hologram data for the first and second linearly polarized light components (e.g., X and Y-polarizations) are integrated with each other.

When the second light intensity distribution region is related to the first light intensity distribution region in symmetry for a light intensity distribution and a phase distribution, the second hologram data might be easily obtained in consideration of the symmetry after the first hologram data is generated.

The hologram data generation method is described in detail in examples below.

The hologram 100 which gives different phase distributions to the wavefronts of the first linearly polarized light component (e.g., X-polarization) and the second linearly light component (e.g., Y-polarized light) is explained in detail below.

Figure 5:
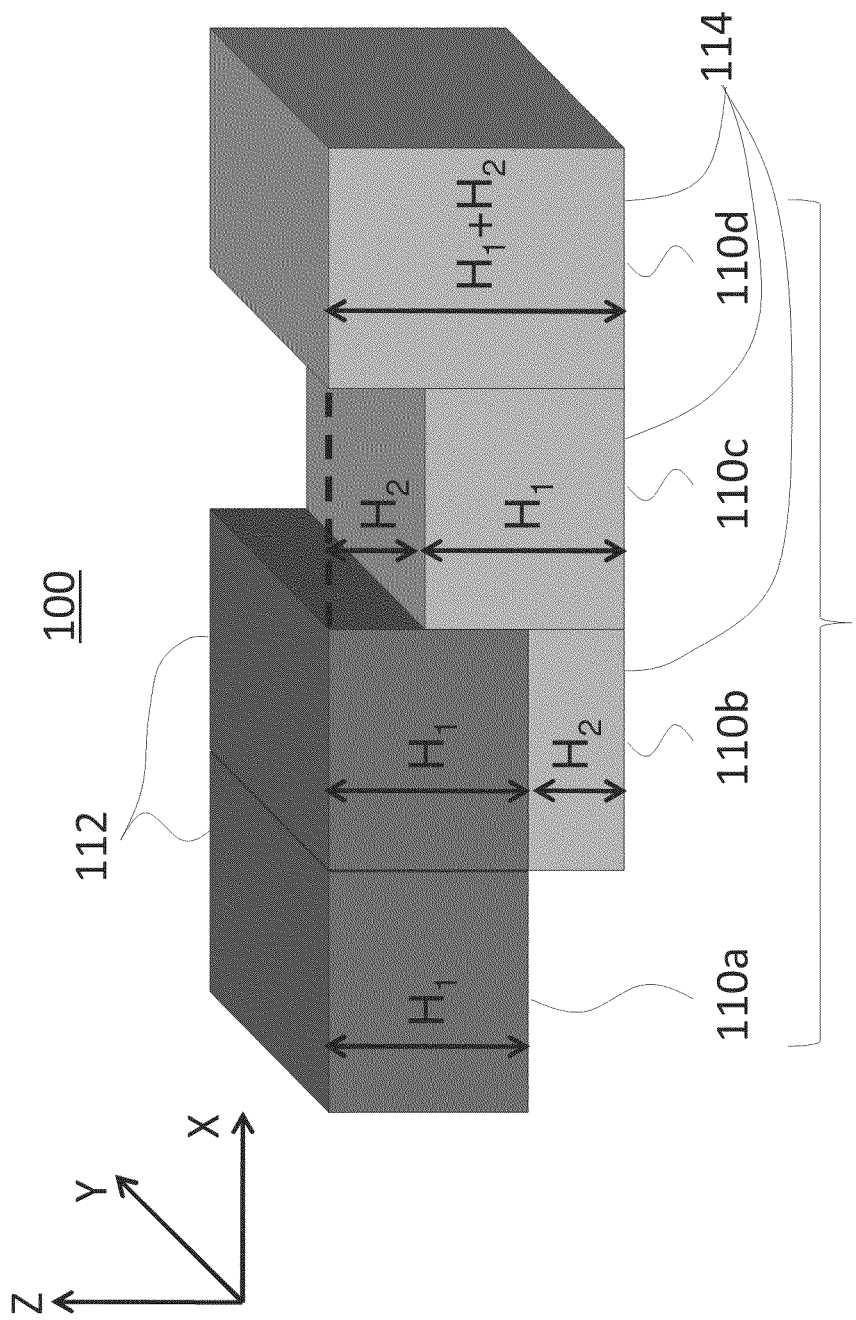
FIG. 5 is a perspective view showing a cell structure.

FIG. 5 is a perspective view showing a cell structure which forms the hologram 100. As shown in FIG. 5, the hologram 100 might include a plurality of rectangular cells 110. As will be described later, the dimensions and arrangements of the plurality of cells 110 are set such that the X-polarization is in phase with, or $\pi$ out of phase from the Y-polarized light, in each overlap region MA in which the first light intensity distribution $LI_1$ and the second light intensity distribution $LI_2$ are superposed on each other.

To give different phase distributions to the wavefronts of X-polarization and Y-polarized light, the hologram 100 might independently control the wavefronts in the respective polarization directions. For example, in order to form two phase levels for each of the X- and Y-polarizations, it is possible to give binary phases to the wavefronts in each of the two polarization directions. For this purpose, four types of cell structures might be included in the hologram 100. Each of cells 110a to 110d shown in FIG. 5 has a cell structure of one of these four types. The hologram 100 is formed by arraying cells 110 of four types in a tetragonal lattice pattern.

As shown in FIG. 5, the plurality of cells 110 include anisotropic media 112 which change the polarization state of an incident light, and isotropic media 114 which do not change the polarization state of the incident light. More specifically, the cell 110a includes an anisotropic medium 112 alone, the cell 110b includes an anisotropic medium 112 and isotropic medium 114, and each of the cells 110c and 110d includes an isotropic medium 114 alone. That the isotropic media 114 do not change the polarization state of the incident light means herein that they do not change the polarization state of the incident light compared to the anisotropic media 112. For this reason, this embodiment assumes that a medium in which the difference between their refractive indices with respect to X-polarization and Y-polarized light is 0 (inclusive) to 0.001 (inclusive) in an isotropic medium.

The plurality of cells 110 might include an anisotropic cell which has an anisotropic medium configured to change a polarization state of the incident light as described above.

The steps among the cells 110a to 110d in the Z direction can be represented by using a refractive index n of the isotropic medium 114, a refractive index $n_x$ of the anisotropic medium 112 with respect to X-polarization, and a refractive index $n_y$ of the anisotropic medium 112 with respect to Y-polarized light. This embodiment exemplifies a case in which $n=n_x>n_y$.

To configure a two-phase-level computer generated hologram as the hologram 100, a cell to shift a phase of $\pi$ is necessary. To attain this state, thicknesses $H_1$ of the anisotropic medium 112 of the cell 110a and the isotropic medium 114 of the cell 110c need satisfy:

$$H_1 = \frac{1}{2}\frac{\lambda}{n_x - n_y} = \frac{1}{2}\frac{\lambda}{n - n_y} \quad (2)$$

A thickness $H_2$ of the isotropic medium 114 of the cell 110b, that is, a difference $H_2$ between the thickness of the cell 110c and that of the cell 110b or 110d (a difference $H_2$ between the thickness of the isotropic medium 114 of the cell 110c and that of the isotropic medium 114 of the cell 110d) need satisfy:

$$H_2 = \frac{1}{2}\frac{\lambda}{n - 1} \quad (3)$$

Assuming X-polarization which impinges on the cell 110c as a reference, X-polarization which impinges on the cell 110a is in phase with the reference. Also, assuming Y-polarized light which impinges on the cell 110c as a reference, Y-polarized light which impinges on the cell 110a is $\pi$ out of phase from the reference.

Assuming X-polarization which impinges on the cell 110c as a reference, X-polarization which impinges on the cell 110b is $\pi$ out of phase from the reference. Also, assuming Y-polarized light which impinges on the cell 110c as a reference, Y-polarized light which impinges on the cell 110b is in phase with the reference.

Assuming X-polarization which impinges on the cell 110c as a reference, X-polarization which impinges on the cell 110d is $\pi$ out of phase from the reference. Also, assuming Y-polarized light which impinges on the cell 110c as a reference, Y-polarized light which impinges on the cell 110d is also $\pi$ out of phase from the reference.

In this manner, the computer generated hologram can give binary phases to the wavefronts in the two polarization directions respectively by using the cell structures of four types (cells 110a to 110d) shown in FIG. 5. In other words, the cell structures of four types shown in FIG. 5 exemplify four combinations of phases given to the wavefronts of the X-polarization and Y-polarized light, that is, $(0, \pi)$, $(\pi, 0)$, $(0, 0)$, and $(\pi, \pi)$.

A case in which $n_x=n=1.6$ and $n_y=1.4$ will be exemplified as a concrete numerical example. In this case, letting $\lambda$ be the wavelength of the incident light, the thicknesses $H_1$ and $H_2$ are $2.5\lambda$ and $0.833\lambda$, respectively, that fall within few multiples of the wavelength $\lambda$. These values are realistic as the thicknesses of the cells of a computer generated hologram.

In one example, the anisotropic media 112 might include an anisotropic layer. The anisotropic media 112 of all cells may have identical optic axis directions. If the anisotropic media 112 of all the cells shown in FIG. 5 have identical optic axis directions, at least one cell (the cell 110b in this embodiment) includes an anisotropic medium 112 formed by the anisotropic layer, and an isotropic medium 114 formed by an isotropic layer.

The optic axis means herein an axis along a direction in which, because the refractive indices in all directions perpendicular to a propagation direction of an incident light are constant in the anisotropic medium 112, no birefringence occurs even if non-polarized light impinges on the anisotropic cell so that ordinary and extraordinary rays match each other or have a minimum deviation if any.

Figure 6:
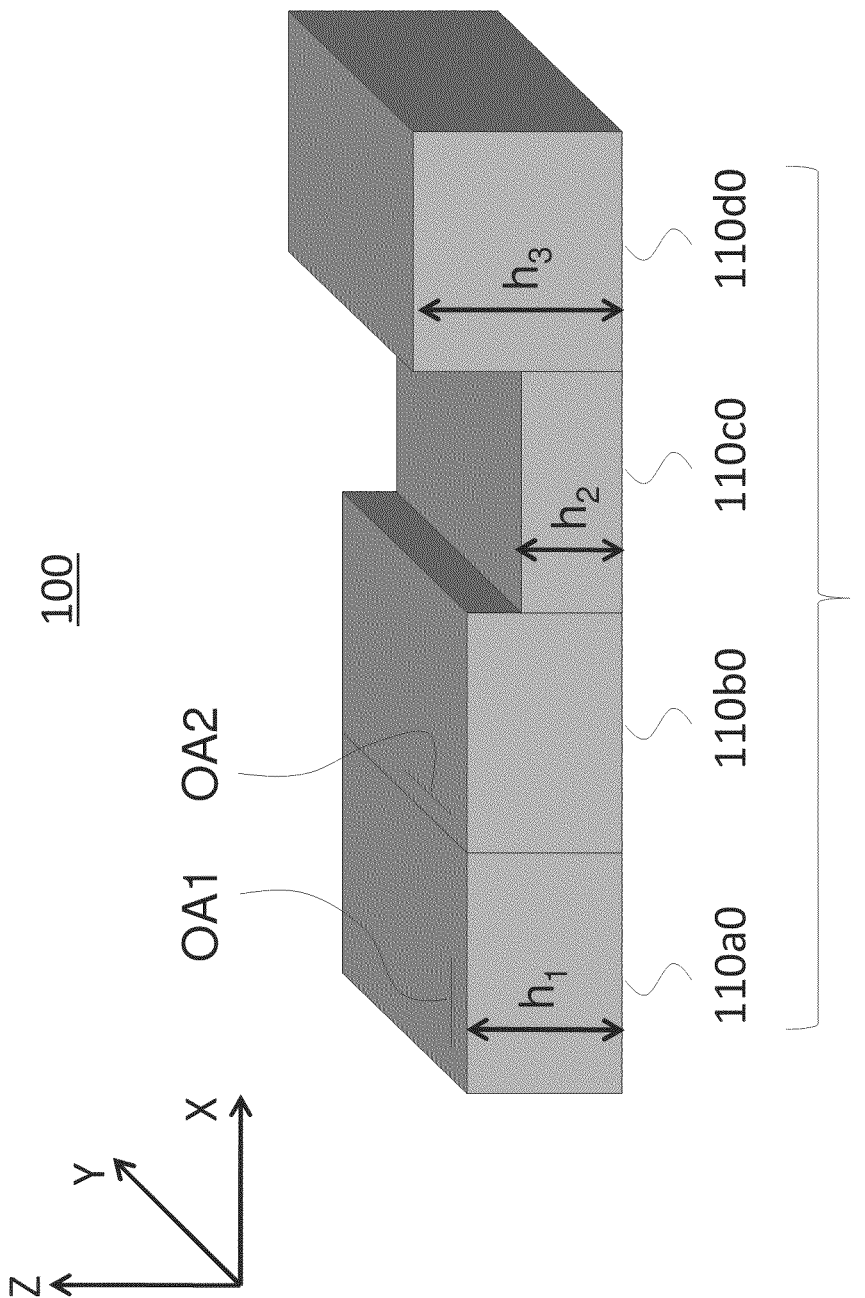
FIG. 6 is a perspective view showing a cell structure.

In another example, the anisotropic media 112 might be included in an anisotropic cell. The anisotropic media 112 of respective cells may have different optic axis directions. FIG. 6 is a perspective view showing a cell structure which forms a hologram 100 including anisotropic cells. If the cells of the hologram 100 do not have identical optic axis directions, that is, the optic axis direction of each cell is selected freely, each cell of four types can be formed from an anisotropic medium 112 or isotropic medium 114 alone. In other words, each cell may not be formed by a combination of an anisotropic medium 112 or isotropic medium 114. In this case, the hologram 100 includes a first anisotropic cell 110a0, a second anisotropic cell 110b0, a first isotropic cell 110c0, and a second isotropic cell 110d0, as shown in FIG. 6. The first anisotropic cell 110a0 and second anisotropic cell 110b0 are made of, for example, birefringent materials. The direction of an optic axis $OA_1$ of the first anisotropic cell 110a0 is different from that of an optic axis $OA_2$ of the second anisotropic cell 110b0, and, for example, they intersect at right angles with each other, as shown in FIG. 6.

As described above, the plurality of cells 100 might include anisotropic cells including an anisotropic medium configured to change a polarization state of the incident light, and isotropic cells including an isotropic medium configured not to change a polarization state of the incident light.

Note that a function of setting light components in two polarization directions of the incident light to be in phase with, or $\pi$ out of phase from each other, in the cells 110a0 to 110d0 of four types of the computer generated hologram 100 shown in FIG. 6 is the same as in the cells 110a to 110d of four types of the computer generated hologram 100 shown in FIG. 5.

Thicknesses (the thicknesses in the Z direction) $h_1$ of the first anisotropic cell 110a0 and second anisotropic cell 110b0, a thickness $h_2$ of the first isotropic cell 110c0, and a thickness $h_3$ of the second isotropic cell 110d0 can be represented by using the following three refractive indices (first to third refractive indices). The first refractive indices are a refractive index $n_E$ of the first anisotropic cell 110a0 with respect to X-polarization, and a refractive index $n_E$ of the second anisotropic cell 110b0 with respect to Y-polarized light. The second refractive indices are a refractive index no of the first anisotropic cell 110a0 with respect to Y-polarized light, and a refractive index no of the second anisotropic cell 110b0 with respect to X-polarization. The third refractive indices are refractive indices n of the first isotropic cell 110c and second isotropic cell 110d. This embodiment exemplifies a case in which $n_O > n_E$.

To configure a two-step computer generated hologram 100, a phase shift of π is necessary. To attain this state, the thicknesses $h_1$ of the first anisotropic cell 110a0 and second anisotropic cell 110b0 need satisfy:

$$h_1 = \frac{1}{2}\frac{\lambda}{n_O - n_E} \quad (4)$$

To form a wavefront matching the one obtained at the refractive index no of the first anisotropic cell 110a0 with respect to Y-polarized light and the refractive index no of the second anisotropic cell 110b0 with respect to X-polarization, the thickness $h_2$ of the first isotropic cell 110c0 need satisfy:

$$h_2 = \frac{n_O - 1}{n - 1} h_1 \quad (5)$$

Also, to form a wavefront matching the one obtained at the refractive index $n_E$ of the first anisotropic cell 110a0 with respect to X-polarization and the refractive index $n_E$ of the second anisotropic cell 110b0 with respect to Y-polarized light, the thickness $h_3$ of the second isotropic cell 110d0 need satisfy:

$$h_3 = \frac{n_E - 1}{n - 1} h_1 \quad (6)$$

A case in which $n_O = 1.6$, $n_E = 1.4$, and $n = 1.5$ will be exemplified as a concrete numerical example. In this case, letting λ be the wavelength of the incident light, the thicknesses $h_1$, $h_2$, and $h_3$ are 2.5λ, 2λ, and 3λ, respectively, that fall within few multiples of the wavelength λ. These values are realistic as the thicknesses of the cells of a computer generated hologram.

Figure 7:
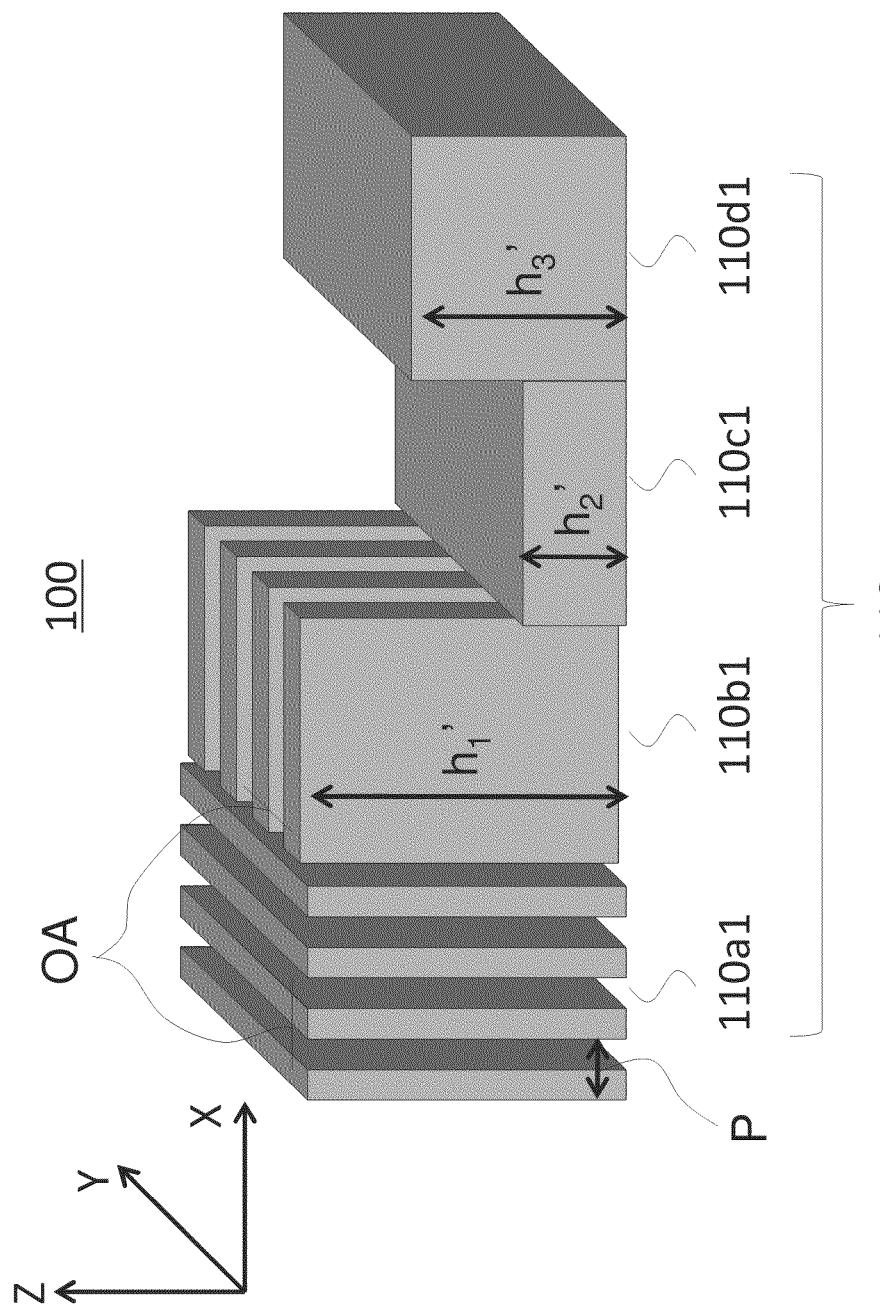
FIG. 7 is a perspective view showing a cell structure having a three-dimensional structure which generates form birefringence.

Each of the first anisotropic cell 110a0 and second anisotropic cell 110b0 may be formed from a diffraction grating (three-dimensional structure) which generates form birefringence. In other words, the anisotropic medium may include one of a birefringent material and a three-dimensional structure which generates form birefringence. FIG. 7 is a perspective view showing a cell structure which forms a hologram including anisotropic cells formed from diffraction gratings which generate form birefringence. The hologram 100 shown in FIG. 7 includes a first anisotropic cell 110a1, second anisotropic cell 110b1, first isotropic cell 110c1, and second isotropic cell 110d1.

Each of the first anisotropic cell 110a1 and second anisotropic cell 110b1 is formed from a diffraction grating which generates form birefringence, as described above. Each of the first anisotropic cell 110a1 and second anisotropic cell 110b1 is formed, for example, from a one-dimensional diffraction grating having a periodic structure with a pitch P smaller than the wavelength of the incident light in order to prevent the generation of diffracted light components of orders other than the 0th order.

The first anisotropic cell 110a1 and second anisotropic cell 110b1 are configured such that the direction of the pitch of the periodic structure of the first anisotropic cell 110a1 is different from that of the second anisotropic cell 110b1. This makes it possible to attain a cell which advances the wavefront of X-polarization from that of Y-polarized light, and a cell which retards the wavefront of X-polarization from that of Y-polarized light.

Japanese Patent Laid-Open No. 2006-196715 discloses a diffraction grating made of quartz as an example of the diffraction grating which generates form birefringence. According to Japanese Patent Laid-Open No. 2006-196715, when quartz has a refractive index of 1.56 with respect to a wavelength of 193 nm, and the duty ratio of the diffraction grating in the form birefringence region is 1:1 (=0.5), a refractive index $n_\perp$ of the diffraction grating in the direction of the pitch is 1.19, and a refractive index $n_{//}$ of the diffraction grating in a direction perpendicular to the pitch is 1.31.

Even when each anisotropic cell is formed from a diffraction grating which generates form birefringence, thicknesses $h_1'$ of the first anisotropic cell 110a1 and second anisotropic cell 110b1 need satisfy equation (4) upon substituting $h_1'$ for $h_1$. Likewise, a thickness $h_2'$ of the first isotropic cell 110c1 need satisfy equation (5) upon substituting $h_2'$ for $h_2$, and a thickness $h_3'$ of the second isotropic cell 110d1 need satisfy equation (6) upon substituting $h_3'$ for $h_3$.

A case in which the first anisotropic cell 110a1 and second anisotropic cell 110b1 are made of quartz compatible with a wavelength λ=193 nm will be exemplified as a concrete numerical example. The refractive index of the quartz is assumed to be 1.56, a refractive index $n_\perp$ of the diffraction grating in the direction of the pitch is assumed to be 1.19, and a refractive index $n_{//}$ of the diffraction grating in a direction perpendicular to the pitch is assumed to be 1.31, as described above. To obtain the thicknesses $h_1'$ of the first anisotropic cell 110a1 and second anisotropic cell 110b1, the thickness $h_2'$ of the first isotropic cell 110c1, and the thickness $h_3'$ of the second isotropic cell 110d1 using equations (4) to (6), it is only necessary to substitute $n_\perp$ for $n_E$ and substitute $n_{//}$ for $n_O$. In this case, the thicknesses $h_1'$ of the first anisotropic cell 110a1 and second anisotropic cell 110b1 are 4.17λ from equation (4). This value is equal to the thickness of a λ/2 plate as one type of wave plate. From equations (5) and (6), the thickness $h_2'$ of the first isotropic cell 110c1 and the thickness $h_3'$ of the second isotropic cell 110d1 are 1.41λ and 2.31λ, respectively, that are smaller than the thicknesses $h_1'$ of the first anisotropic cell 110a1 and second anisotropic cell 110b1. In this manner, the thicknesses $h_1'$ of the first anisotropic cell 110a1 and second anisotropic cell 110b1, the thickness $h_2'$ of the first isotropic cell 110c1, and the thickness $h_3'$ of the second isotropic cell 110d1 fall within the thickness of the λ/2 plate. 4.17λ is realistic as the thickness of the cell of a computer generated hologram.

This embodiment has exemplified a two-phase-level computer generated hologram as the hologram 100, so the hologram 100 can be formed from anisotropic cells having one thickness and isotropic cells having two thicknesses. However, the present invention is not particularly limited to the two-phase-level computer generated hologram, and is applicable to a computer generated hologram of a multiple of steps more than two phase levels which is formed from anisotropic cells having more than one thickness, and isotropic cells having more than two thicknesses. In this embodiment, the one-dimensional diffraction grating is used as the diffraction grating which generates form birefringence, and a two-dimensional diffraction grating may be used. The phase of the computer generated hologram is not limited to quantized levels (i.e., discrete levels), and the phase of the hologram might be changed continuously by changing the thickness of each cell continuously.

Note that although this embodiment has exemplified only the cell structure of the hologram 100, it may not be easy to bond materials having different properties, as shown in FIGS. 5, 6, and 7. Furthermore, if each anisotropic cell is formed from a diffraction grating which generates form birefringence, as shown in FIG. 7, the diffraction grating floats in the air, which might be hard to maintain. In view of this, in practice, the above-described anisotropic cells and isotropic cells might be formed on a substrate made of, for example, quartz.

In the FIG. 5, a direction along the optical axis for anisotropic media 112 of every cell coincides with each other. Therefore, all anisotropic media 112 in hologram 100 might be formed on a substrate made of the same anisotropic media, and all isotropic media 114 might be formed on a substrate made of the same isotropic media. More specifically, the anisotropic substrate is located at the upper-side of the plurality of cells 110, and the isotropic substrate is located at the bottom-side of the plurality of cells 110. In the FIG. 5, the anisotropic media and the isotropic media are in contact with each other, but they also might be separated from each other along Z-direction.

In this embodiment, it is described that the incident light is linearly polarized light including X-polarized light and Y-polarized light having the same amplitude assuming a case in which the hologram 100 forms a light intensity distribution including X-polarized light and Y-polarized light at the same ratio as in annular illumination. A hologram optionally can be designed to be compatible with the formation of a light intensity distribution including X-polarization and Y-polarization at different ratios by using polarized light including X-polarized light and Y-polarized light having different amplitudes as the incident light in order to obtain high efficiency. A partially coherent light can be used as the incident light. Circularly polarized light or elliptic polarization can also be used as the incident light, and in that case the thickness of each cell of the hologram 100 might be required to change.

Example 1

A detailed design example of a computer generated hologram as the hologram 100 will be explained below with reference to a flowchart of FIG. 3.

An example to design the light intensity distribution LI shown in FIG. 2E will be explained.

This target image illustrated in FIG. 2E includes a right and left circularly polarized light and a linearly polarized light along a circumferential direction of concentric circles (i.e., corresponding to S-polarization). The S-polarization means each pixel on the predetermined plane is formed by the linearly polarized light, and the direction of the polarized light for each pixel is along the circumferential direction of concentric circles.

Figure 3:
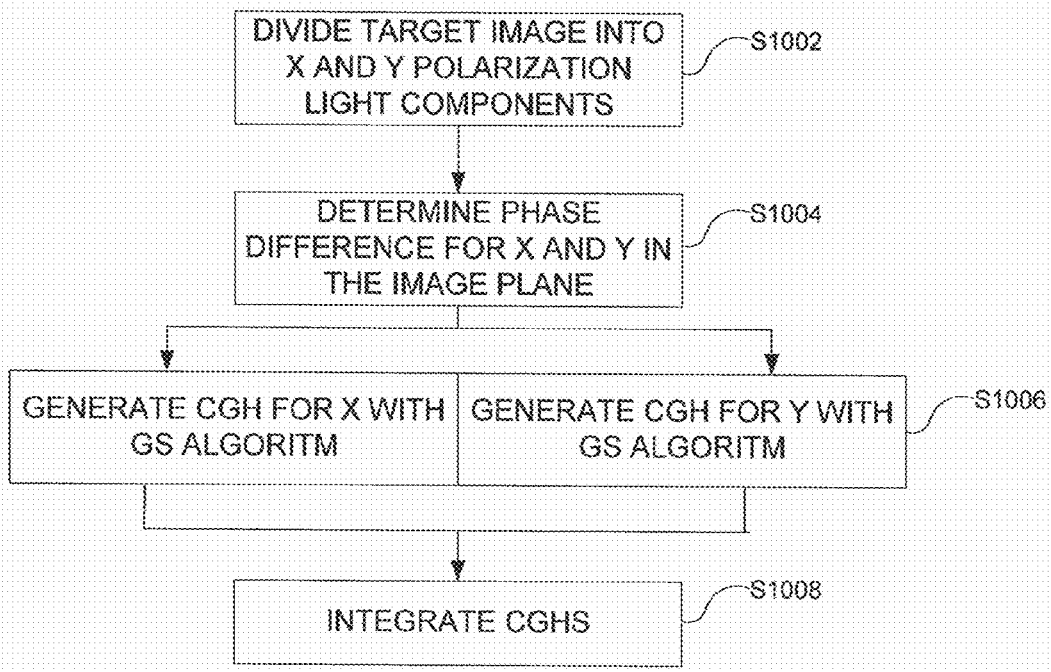
FIG. 3 illustrates a flowchart of a method for generating a computer generated hologram.
Figure 8A:
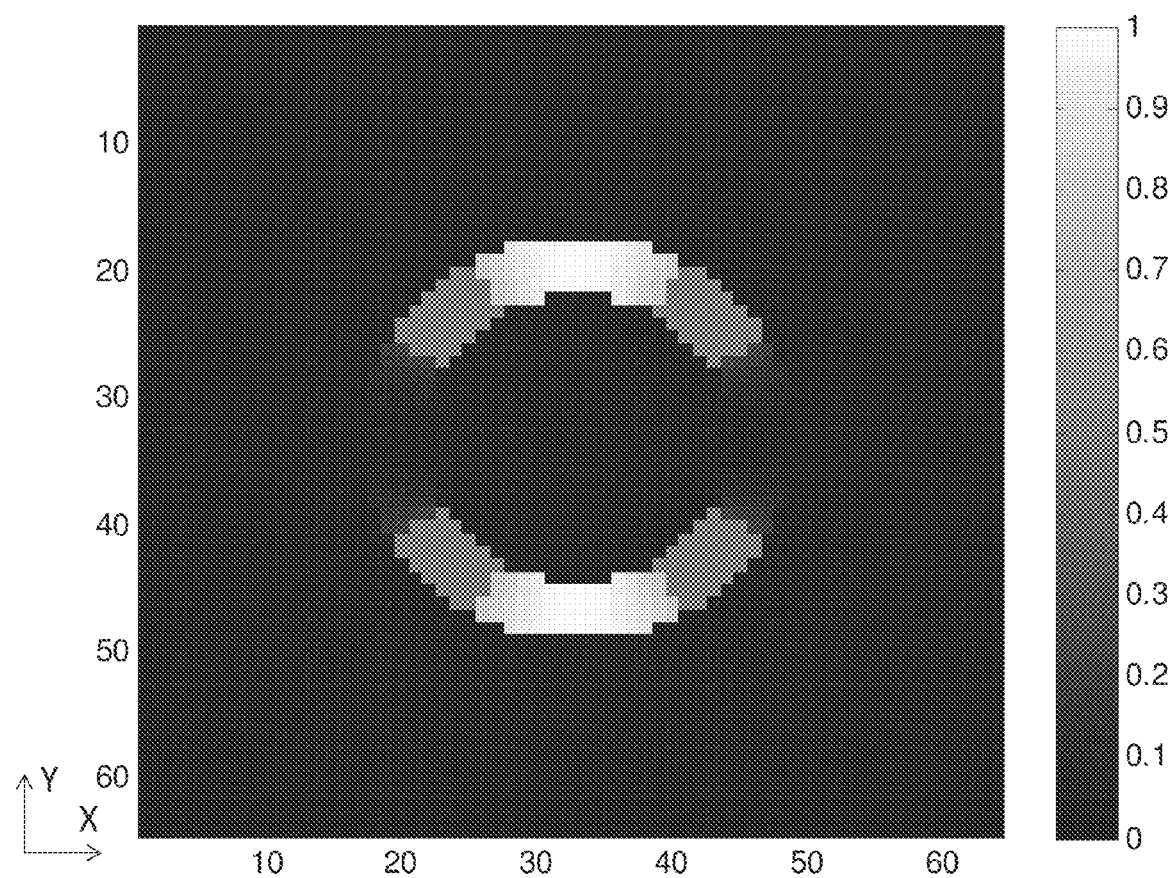
FIGS. 8A and 8B illustrate light intensity distributions divided for X and Y-polarizations.
Figure 8B:
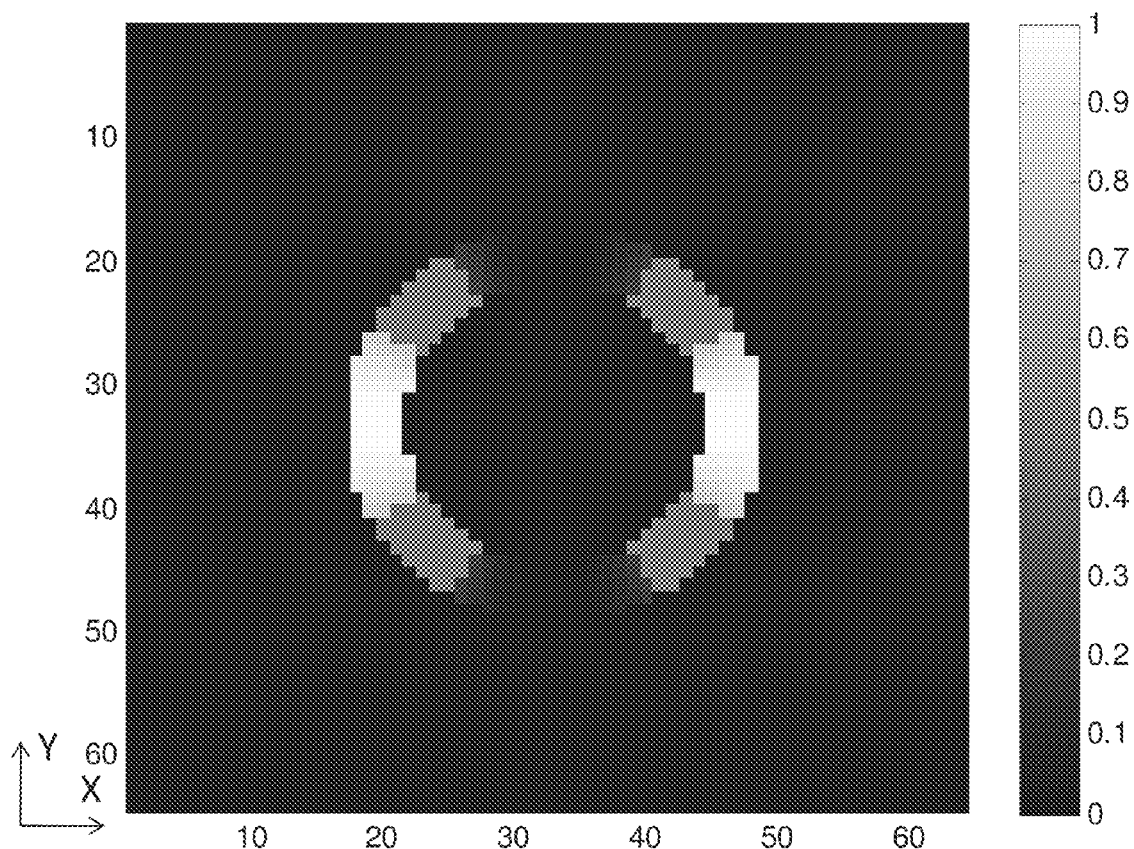

Referring to FIG. 3, in step S1002, the target image is divided into a light intensity distribution formed by X-polarization and another light intensity distribution formed by Y-polarization. More specifically, values are applied into each light intensity distribution region for X and Y-polarizations $LI_1$ and $LI_2$ in FIGS. 2A and 2B. FIGS. 8A and 8B show the light intensity distribution divided for X and Y-polarizations respectively. In FIGS. 8A and 8B, a color closer to white indicates a higher intensity, and that closer to black indicates a lower intensity.

In the portion formed by S-polarization, the method to divide the light intensity distribution depends on the angle of S-polarization. In the portion formed by circularly polarized light, the light intensity distribution is divided on even for X and Y-polarizations.

Figure 8C:
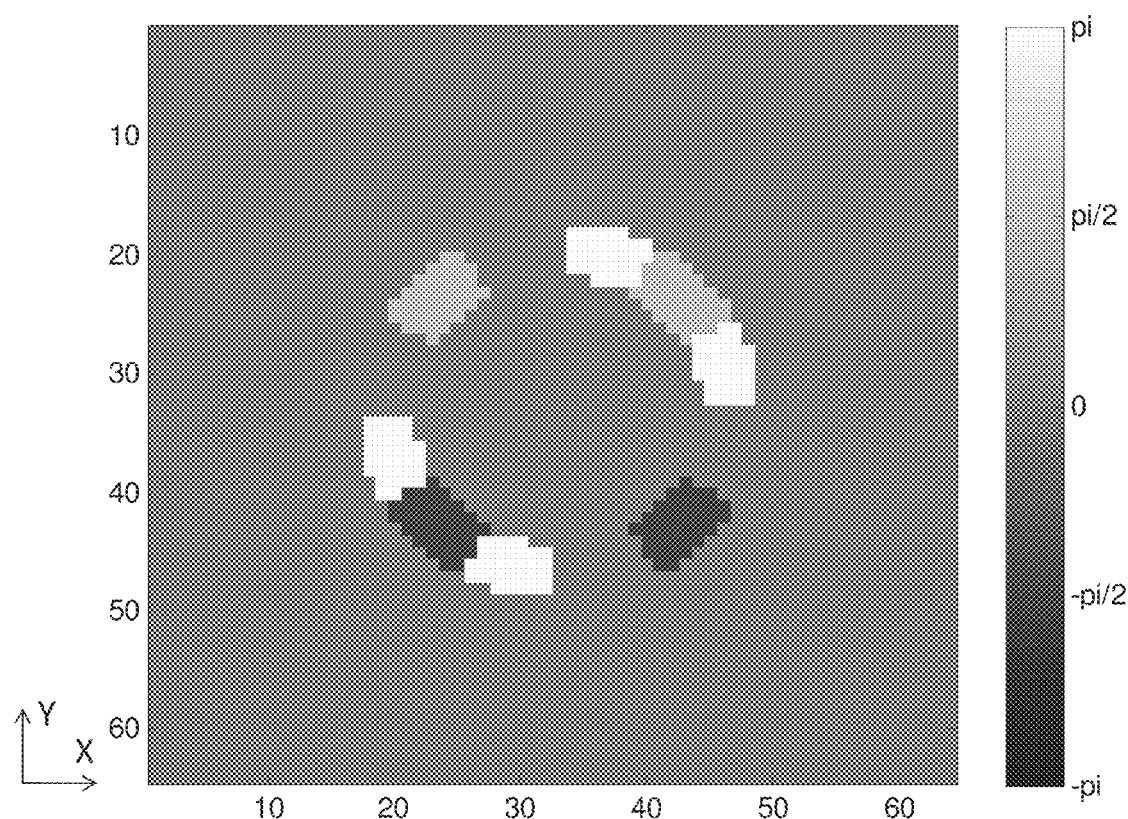
FIG. 8C illustrates a phase difference between X and Y-polarizations on a predetermined plane.

In step S1004, the phase difference between X and Y-polarizations on the predetermined plane is determined. More specifically, values are applied into each portion of MA in FIG. 2D. FIG. 8C shows the phase difference under the condition where the incident light is a linearly polarized light and the polarization direction with respect to the X-axis is +45°. The phase difference in the portion formed by right circularly polarized light is $\pi/2$. The phase difference in the portion formed by left circularly polarized light is $-\pi/2$. The phase difference in the portion formed by S-polarization in the second and fourth quadrant is 0 because the S-polarization can be formed by adjusting the ratio of intensity for X and Y-polarizations of the incident light. The phase difference in the portion formed by S-polarization in the first and third quadrant is $\pi$ because the S-polarization cannot be formed only by adjusting the ratio of intensity for X and Y-polarizations of the incident light. Then, to reverse the phase of one of the X and Y-polarizations included in the incident light is required.

Therefore, the target image (FIG. 2E) includes four portions whose constant value as the phase difference is selected from 0, $\pi/2$, $\pi$ and $-\pi/2$ as shown in FIG. 8C.

In step S1006, hologram data for X and Y-polarizations are generated under an admissibility condition of diffusing the phase of X-polarization while maintaining the phase difference as shown in FIG. 8C. Maintaining the phase difference might be required only in the overlap region. There is no limitation for the phase difference in an area other than the overlap region. Therefore any phase difference can be chosen in the area other than the overlap region.

The phase difference in the overlap region is limited to maintain the determined value, but a phase itself is not limited. Therefore hologram data can be generated with optimization using iterative Fourier transform (i.e., Gerchberg-Saxton algorithm). More specifically, the admissibility condition of diffusing the phase means that random distribution might be used for the initial data for hologram data. In each iterative calculation step, hologram data for X and Y-polarizations are generated separately, then the phase in the overlap region on the predetermined plane might be shifted to maintain the phase difference condition shown in FIG. 8C. The shift of the phase might be executed so that an amount of shifting the phase for X and Y-polarizations becomes smaller. It might not be required to maintain the condition strictly at the initial period for optimization, and shifting the phase to a direction according to the determined condition might be required.

Figure 8D:
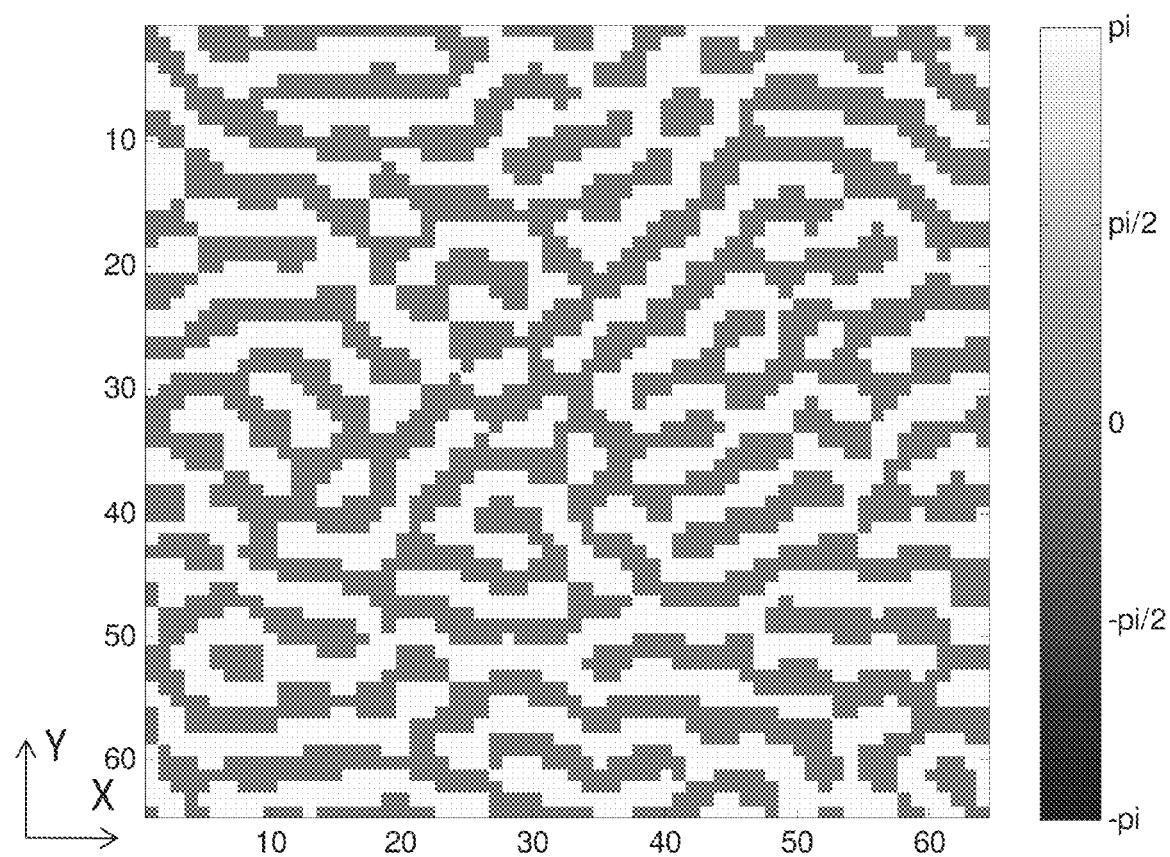
FIGS. 8D and 8E illustrate the phase distributions of a computer generated hologram designed for X and Y-polarizations.
Figure 8E:
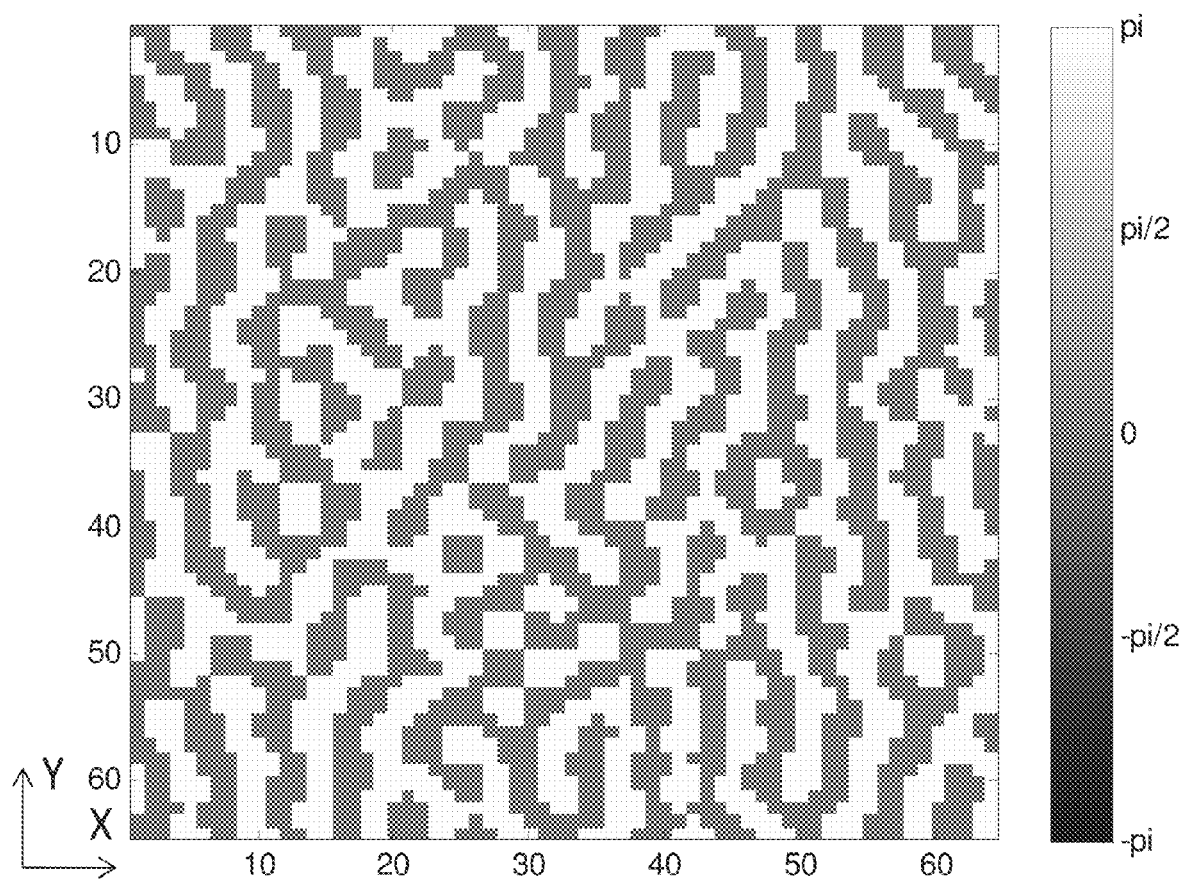
Figure 8F:
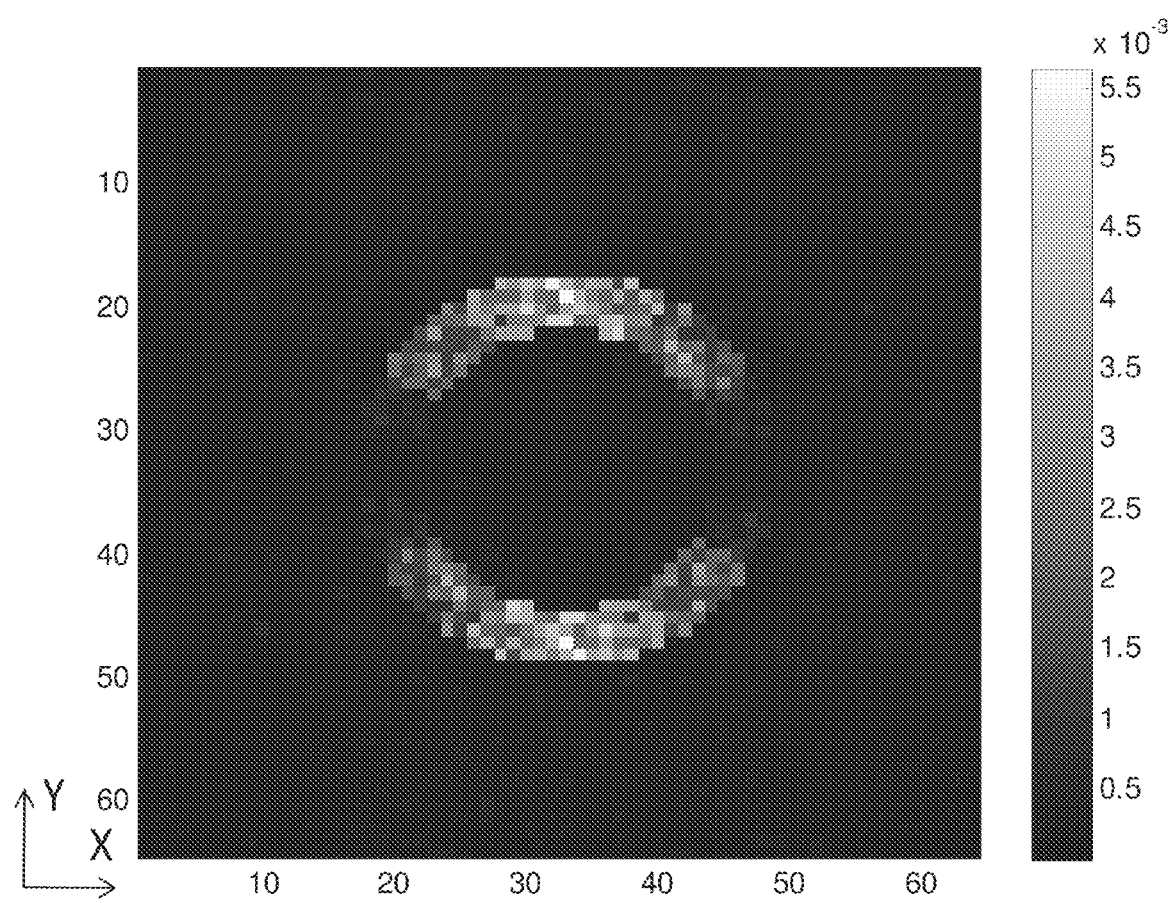
FIGS. 8F and 8G illustrate reconstructed images obtained by using computer generated holograms with the phase distributions shown in FIGS. 8D and 8E, respectively.
Figure 8G:
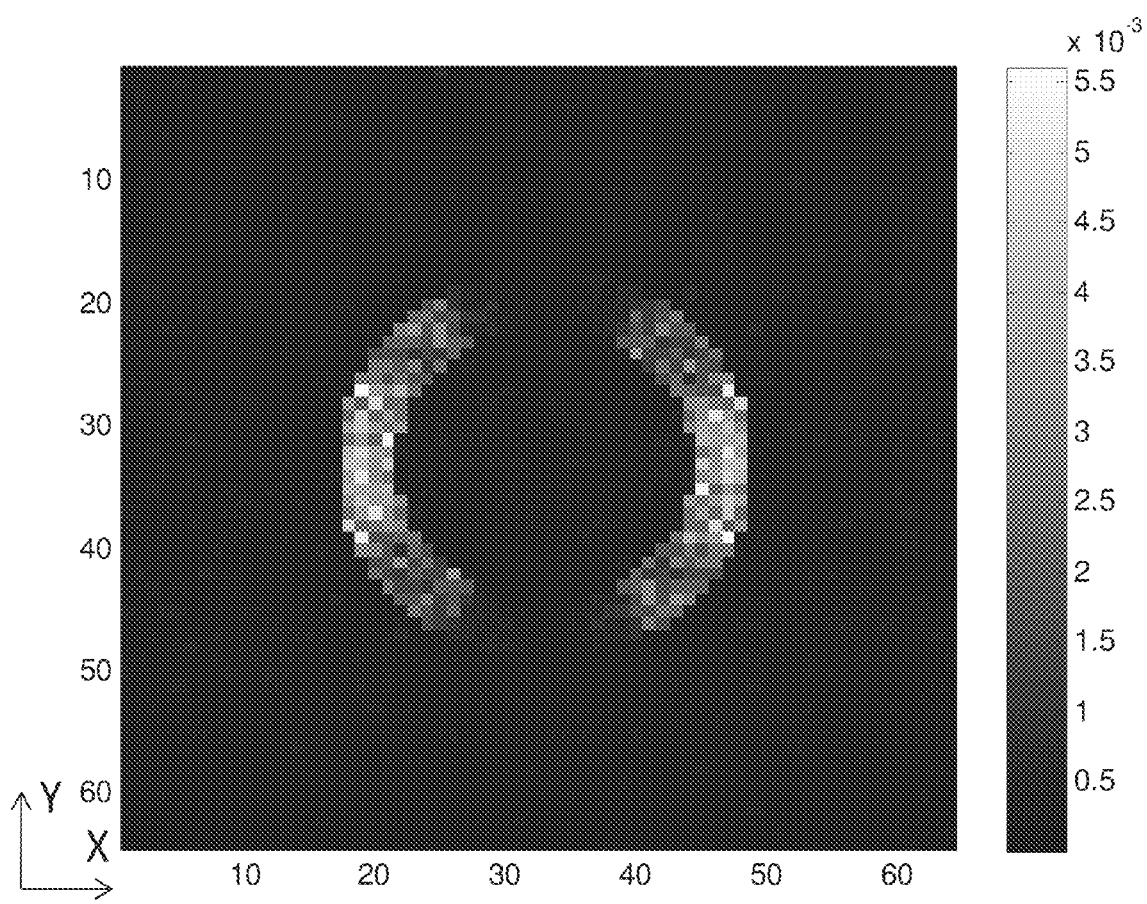

FIGS. 8D and 8E show one example of generated hologram data for X and Y-polarizations, that is the FIGS. 8D and 8E show phase distributions of the holograms. An area of white in FIGS. 8D and 8E indicates the phase is π, and the other area indicates the phase is 0. FIGS. 8F and 8G show reconstructed images with generated hologram data (FIGS. 8D and 8E.) FIGS. 8F and 8G correspond to the light intensity distribution divided for X and Y-polarizations (FIGS. 8A and 8B.) In FIGS. 8F and 8G, a color closer to white indicates a higher intensity, and that closer to black indicates a lower intensity.

Figure 8H:
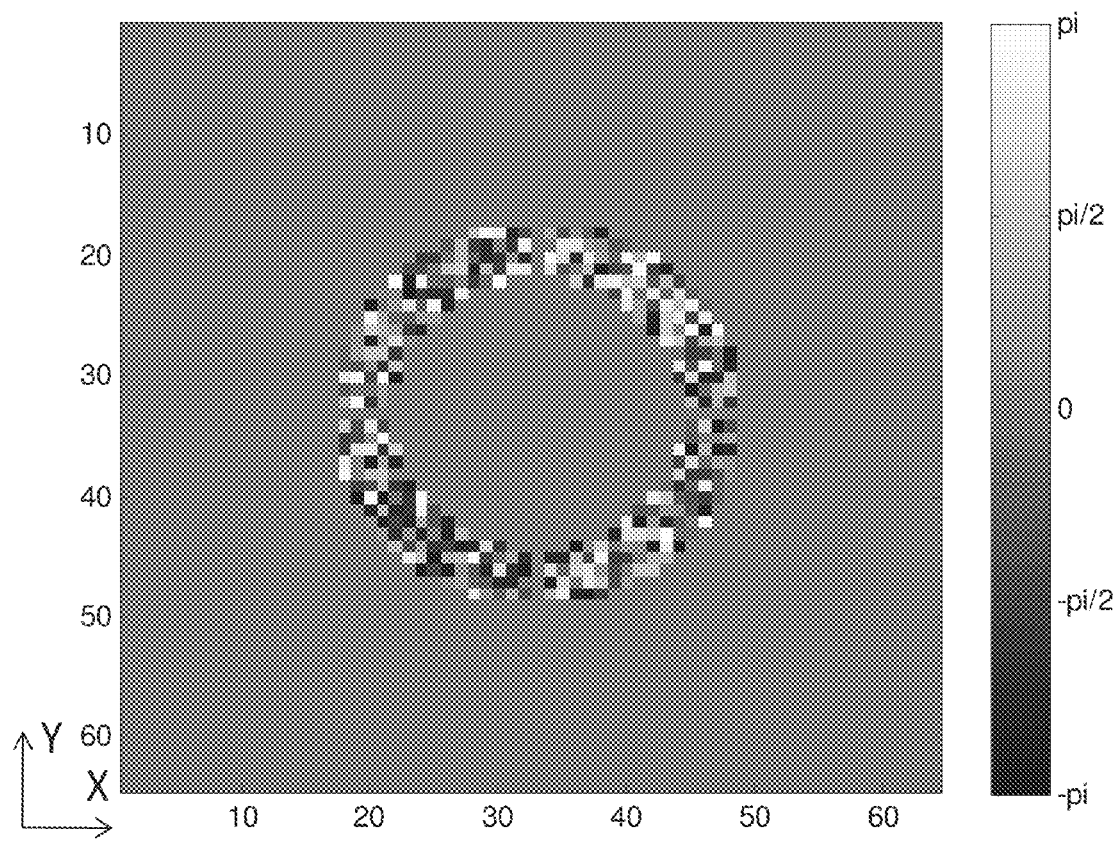
FIGS. 8H and 8I illustrate phase distributions of reconstructed images (FIGS. 8F and 8G), respectively.

FIG. 8H shows the phase distribution on the predetermined plane for X-polarization. The phase distribution is diffused in each portion, in each overlap region and in the light intensity distribution region for X polarization. And also the phase distribution for Y-polarization is diffused as shown in FIG. 8I.

Figure 8I:
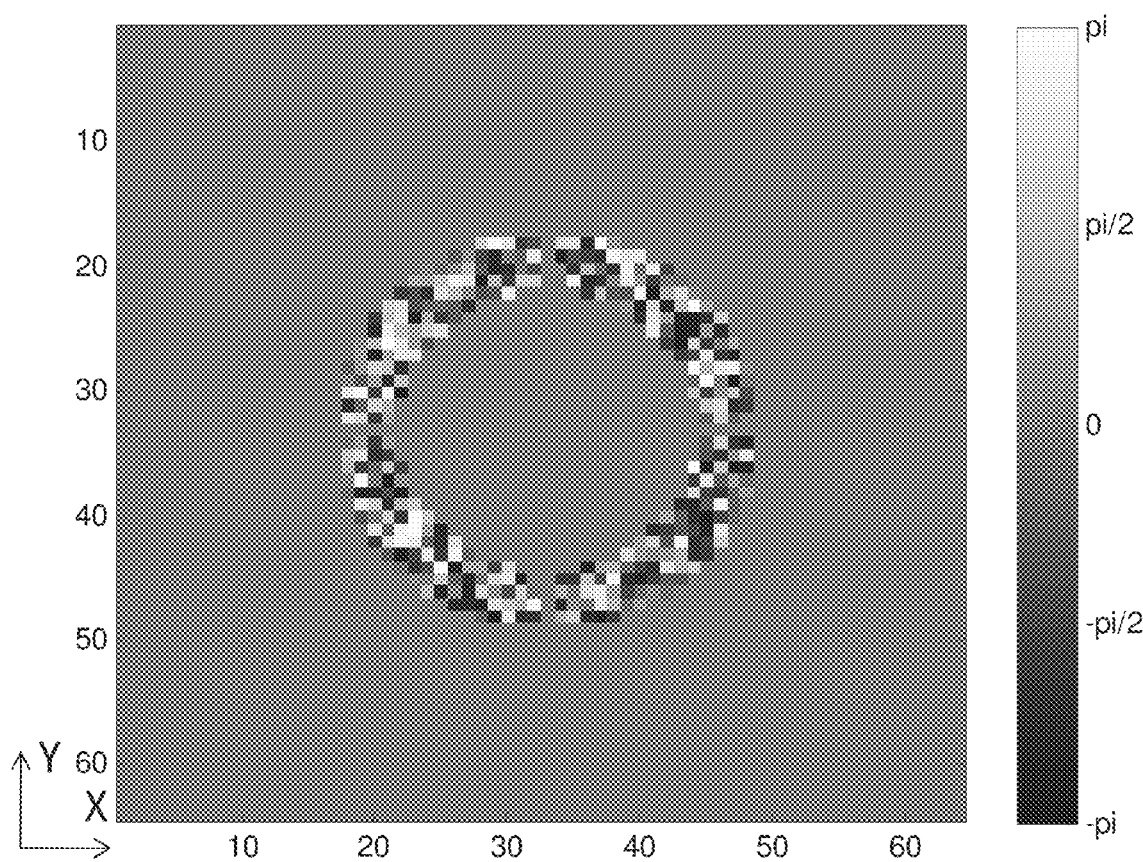
Figure 8J:
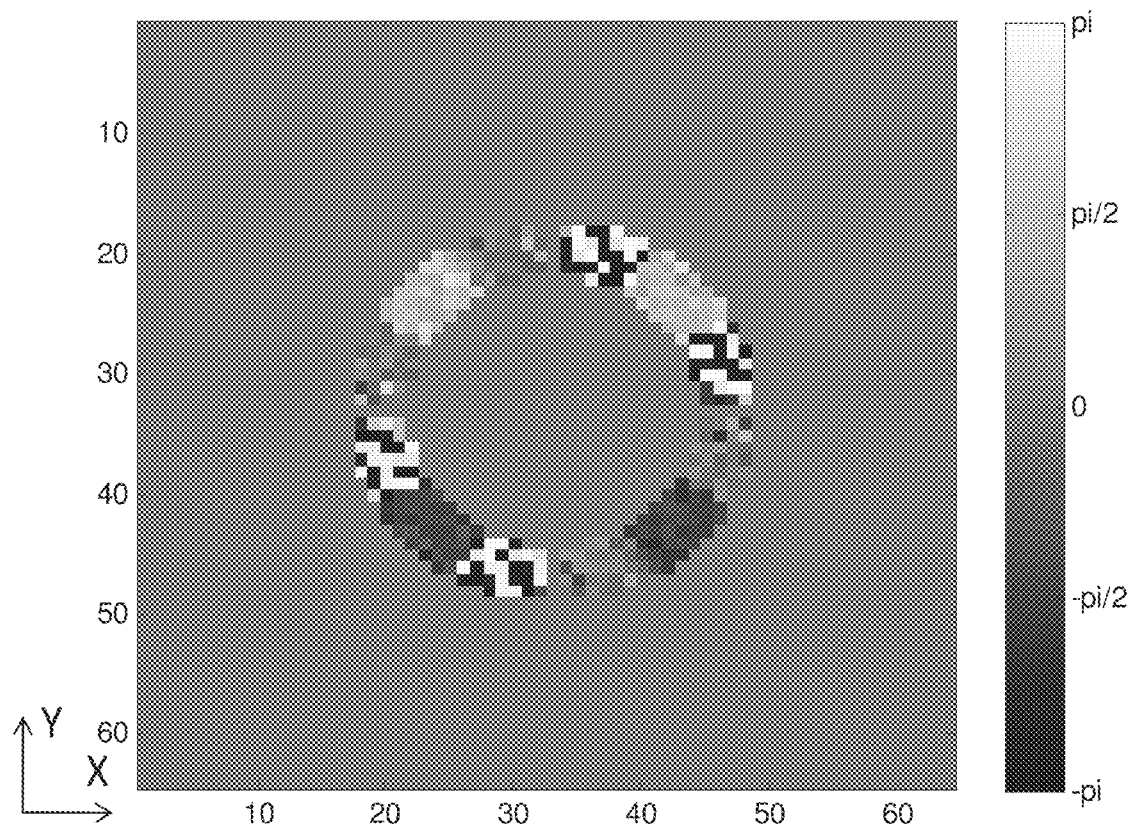
FIG. 8J illustrates a phase difference between FIGS. 8H and 8I.

FIG. 8J shows the phase difference between X and Y-polarizations on the predetermined plane (8H and 8I). Considering a phase periodic property (i.e., π is equal to −π), it is understood that the phase difference illustrated in FIG. 8J corresponds to the phase difference illustrated in FIG. 8C.

The phase difference shown in FIG. 8C is the condition for generating the hologram data. Therefore, the phase difference calculated from the actual generated hologram data has an error as shown in FIG. 8J.

The phase other than the overlap region is replaced with 0 in FIGS. 8H, 8I, and 8J in order to emphasize the phase in the overlap region. Actually, the phase other than the overlap region is composed of not only 0 but also any other values.

The diffused phase on the predetermined plane as shown in FIGS. 8H and 8I means that the reconstructed image is formed by a light emitted from every point of the hologram. In the case that the reconstructed image is formed by the light emitted from every point of the hologram, image quality can be higher due to the high diffractive efficiency. The diffused phase in the computer generated hologram can be realized by controlling the phase difference and not controlling the phases of X- and Y-polarizations in the design method.

In step S1008, the hologram data for X and Y-polarizations generated in step S1006 (FIGS. 8D and 8E) are integrated.

Figure 8K:
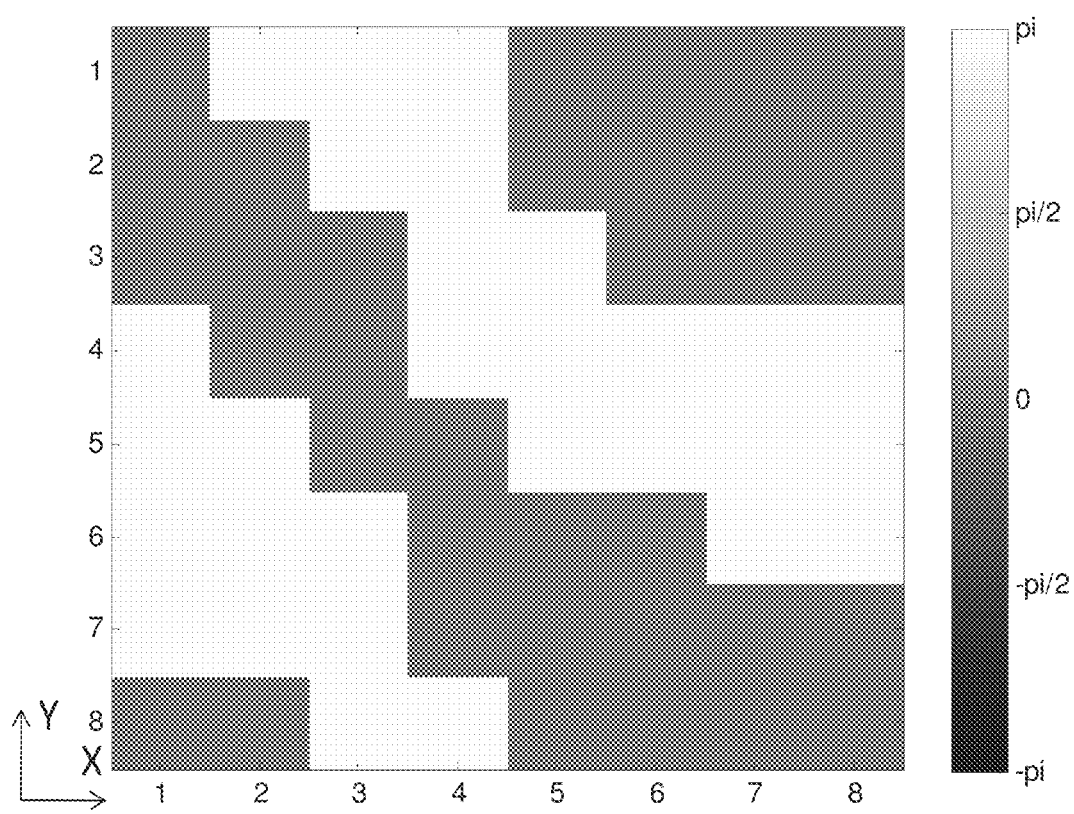
FIGS. 8K and 8L are magnified figures of the left-upper part of FIGS. 8D and 8E, respectively.
Figure 8L:
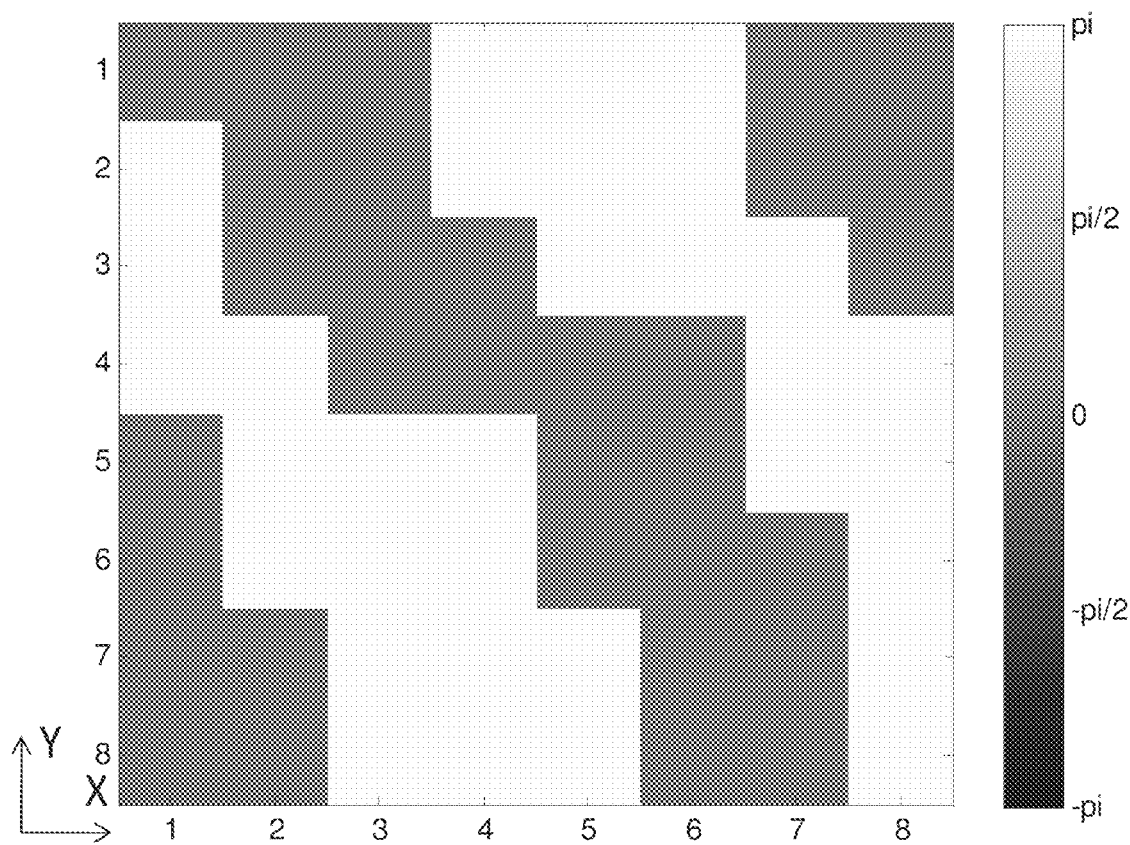
Figure 8M:
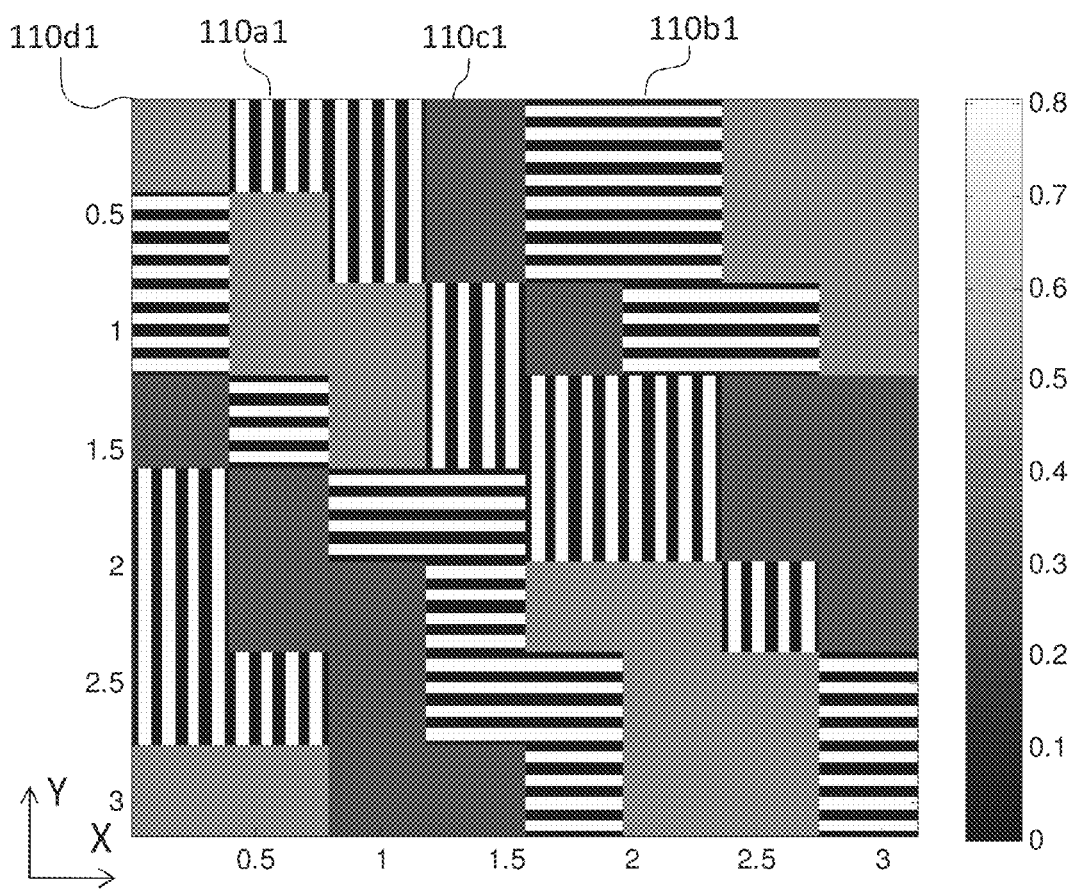
FIG. 8M is a chart showing the thickness of a computer generated hologram obtained by integrating the computer generated hologram compatible with the X-polarization target image and compatible with the Y-polarized light target image.

FIGS. 8K and 8L are magnified figures of the left-upper part of FIGS. 8D and 8E, respectively. FIG. 8M illustrates the thickness of the structure to realize the phase distribution obtained by integrating FIGS. 8K and 8L. In FIG. 8M, reference numerals 110a1, 10b1, 110c1, and 110d1 correspond to cell structures shown in FIG. 7, respectively. In other words, FIG. 8M is a chart showing the thickness of a computer generated hologram which integrates the computer generated hologram compatible with the X-polarization target image (FIG. 8K), and that compatible with the Y-polarized light target image (FIG. 8L). Although the computer generated hologram shown in FIG. 8M has the cell structure shown in FIG. 7, it may optionally have the cell structure shown in FIG. 5 or 6.

In FIG. 8M, the density represents the thickness of each cell (in the Z direction). A color closer to white indicates a larger thickness, and that closer to black indicates a smaller thickness. The numerical values shown in FIG. 8M indicate the thicknesses of the first anisotropic cell 110a1 and second anisotropic cell 110b1, and the thicknesses of the first isotropic cell 110c1 and second isotropic cell 110d1 in the computer generated hologram 100 (unit: μm). Note that the numerical values shown in FIG. 8M exemplify a case in which the first anisotropic cell 110a1 and second anisotropic cell 110b1 are made of quartz having a refractive index of 1.56 with respect to a wavelength of 193 nm.

The structure of the whole hologram area can be generated by the same process.

There are four combinations of the phases of the X-polarization and Y-polarized light in the computer generated hologram, that is, (0, π), (π, 0), (0, 0), and (π, π). The cell structure shown in FIG. 5, 6, or 7 can be used for a computer generated hologram compatible with these four phase combinations. In other words, a computer generated hologram which forms the target image shown in FIG. 2E has the cell structure shown in FIG. 5, 6, or 7.

The cell structure of a computer generated hologram compatible with four phase combinations will be shown in detail. For example, if the combination of the phases of the X-polarization and Y-polarized light is (0, π), the cell 110a shown in FIG. 5, the cell 110a0 shown in FIG. 6, or the cell 110a1 shown in FIG. 7 is adopted. If the combination of the phases of the X-polarization and Y-polarized light is (π, 0), the cell 110b shown in FIG. 5, the cell 110b0 shown in FIG. 6, or the cell 110b1 shown in FIG. 7 is adopted. If the combination of the phases of the X-polarization and Y-polarized light is (0, 0), the cell 110c shown in FIG. 5, the cell 110c0 shown in FIG. 6, or the cell 110c1 shown in FIG. 7 is adopted. If the combination of the phases of the X-polarization and Y-polarization is (π, π), the cell 110d shown in FIG. 5, the cell 110d0 shown in FIG. 6, or the cell 110d1 shown in FIG. 7 is adopted.

When a hologram is formed by combining a plurality of CGHs such as described in the background of the present invention, an irradiance variation might occur in the reconstructed image if the optical integrator cannot sufficiently correct the intensity distribution of the incident light (for example, if the light impinges on only some of these CGHs.) According to the example 1, the illumination variation can be decreased.

When a plurality of separated CGHs are combined, unnecessary diffracted light might be generated due to structural discontinuity at the boundary between the separated-CGHs. According to the example 1, a deterioration of the reconstructed image due to the unnecessary diffracted light can be reduced.

Example 2

A detailed design example of the hologram 100 is described next with reference to a flowchart of FIG. 4. The light intensity distribution LI including phase distribution is line symmetric in the example 2.

An example that is line symmetric with respect to the line y=x (wherein x means the polarization direction of the X-polarization $IL_1$, and y means the second polarization direction of Y-polarization $IL_2$) is described here. The hologram can be designed so that a phase distribution of the Y-polarization intensity distribution is equal to a phase distribution which is realized by flipping a phase distribution of the X-polarization $IL_1$ intensity distribution along the axis. In other words, the hologram data for Y-polarization can be obtained by flipping the hologram data for X-polarization with respect to the line of Y=X.

The example describes y=x as the line symmetric axis. When the line symmetric axis is y=−x, the hologram will be designed by using the similar technique.

Figure 9A:
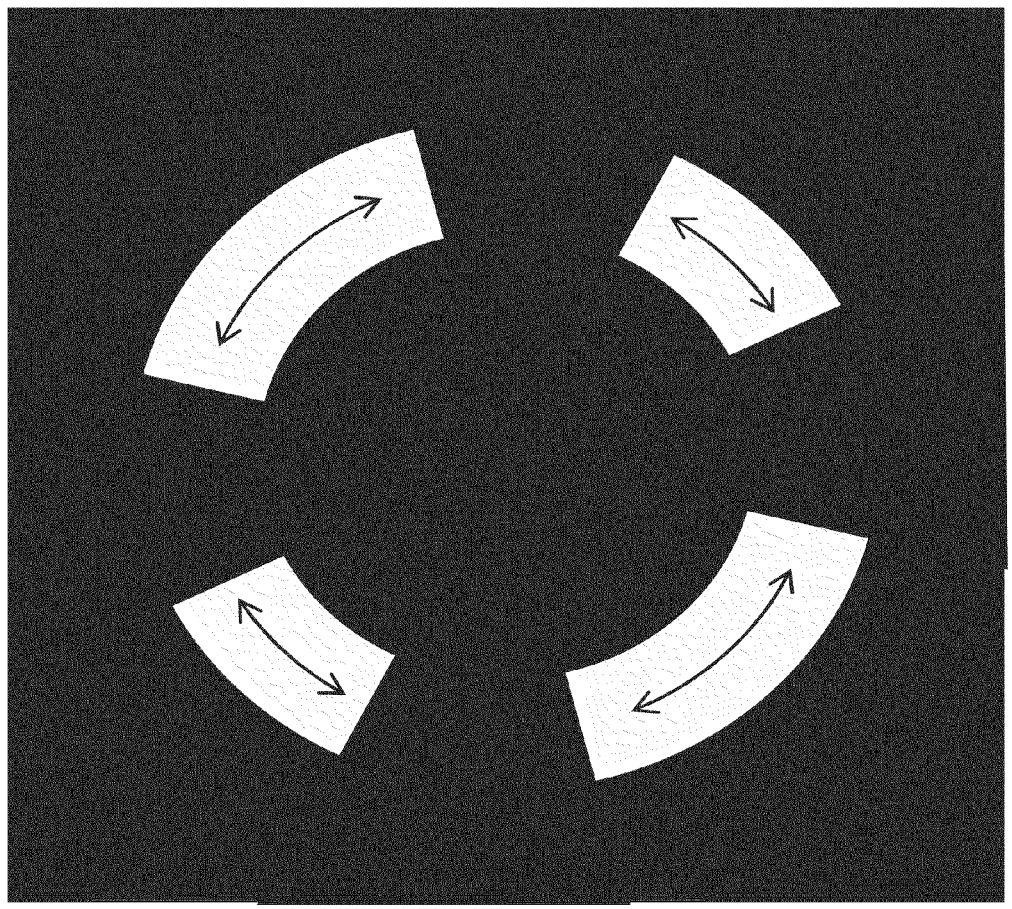
FIG. 9A illustrates an exemplary target image.

FIG. 9A shows the target image which has the line symmetric along the axis y=x. This target image is formed by S-polarization.

Figure 4:
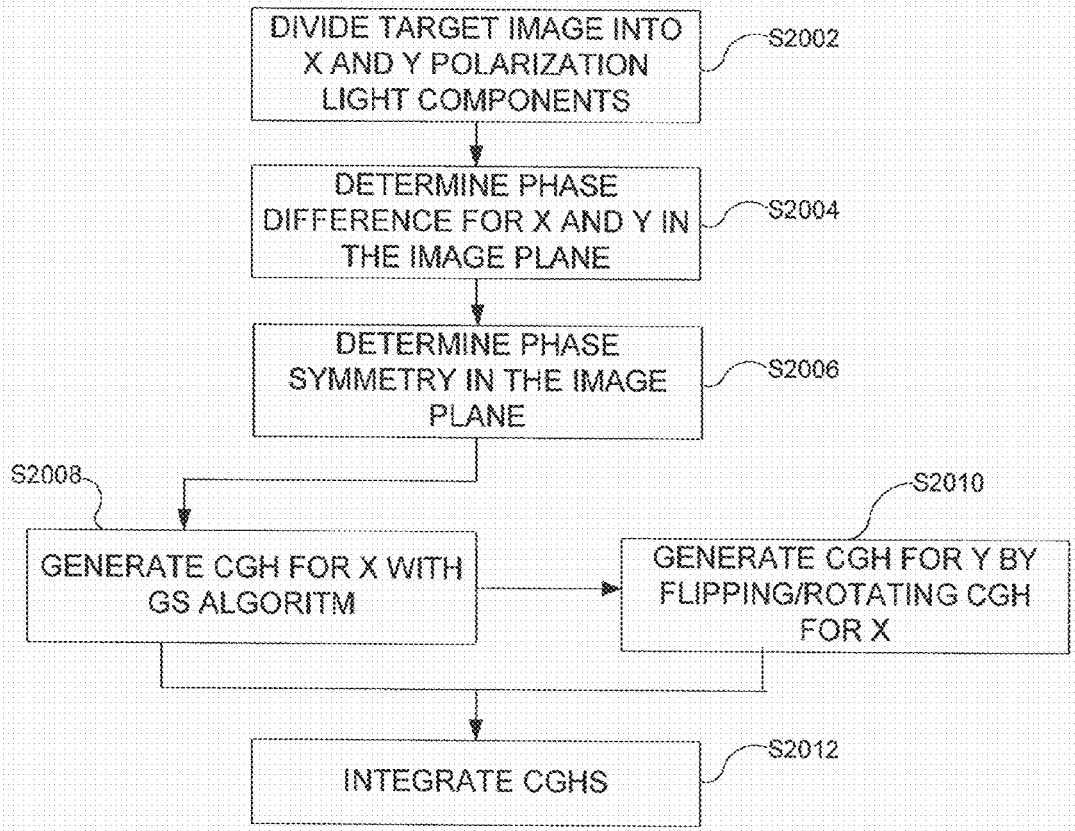
FIG. 4 illustrates a flowchart of a method for generating a computer generated hologram whose target image is symmetric.
Figure 9B:
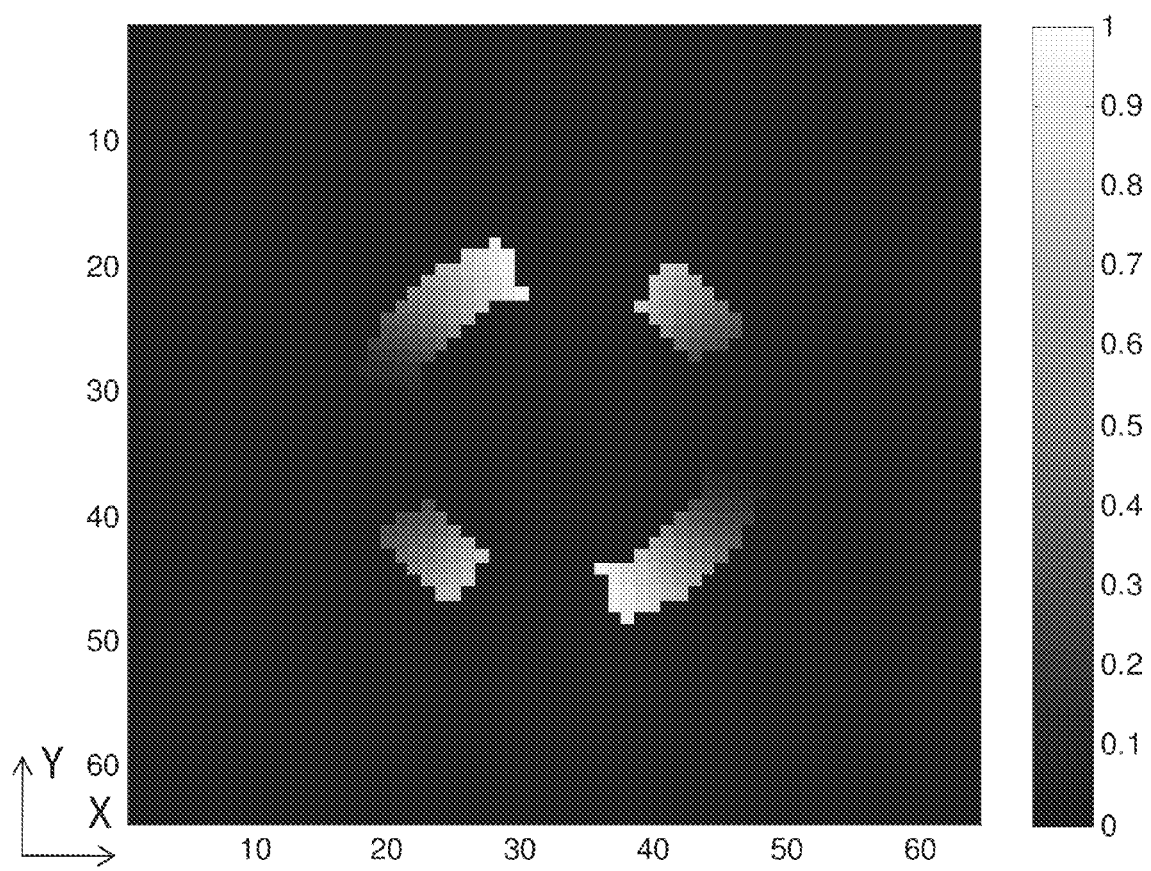
FIGS. 9B and 9C illustrate light intensity distributions divided for X and Y-polarizations, respectively.
Figure 9C:
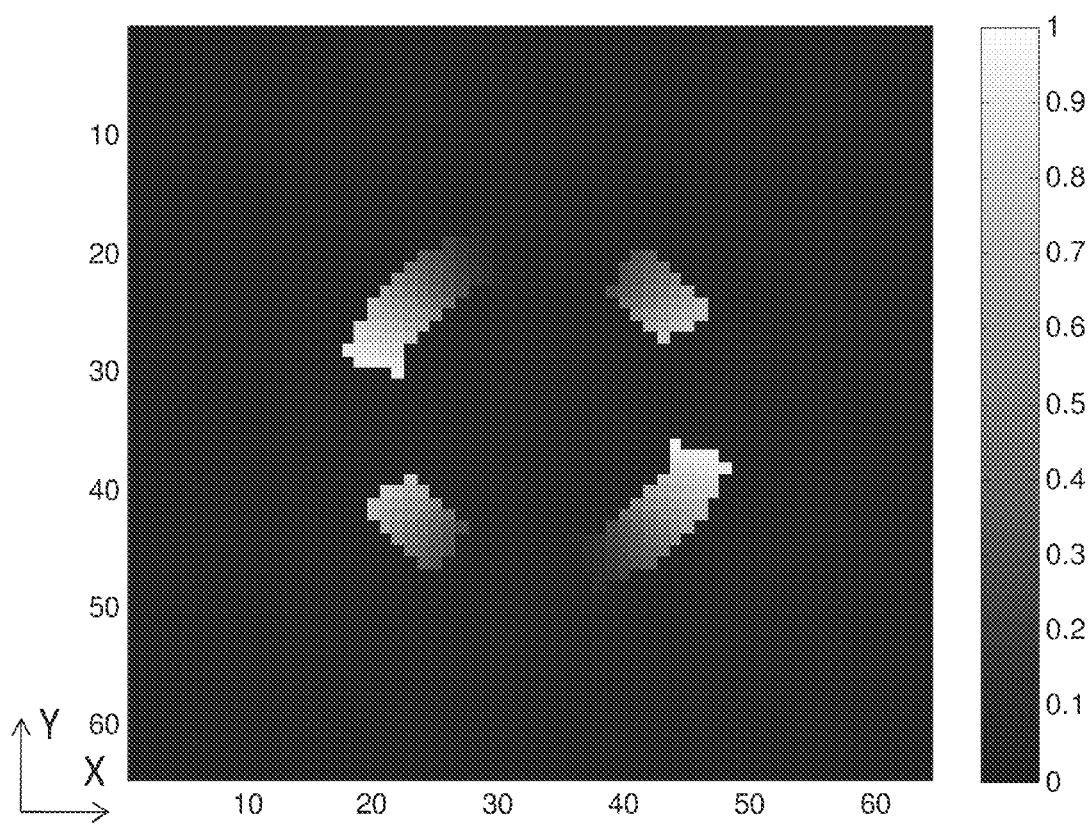

Referring to FIG. 4, in step S2002, the target image is divided into a light intensity distribution formed by X-polarization and another light intensity distribution formed by Y-polarization. FIGS. 9B and 9C show the light intensity distribution divided for X and Y-polarizations.

Figure 9D:
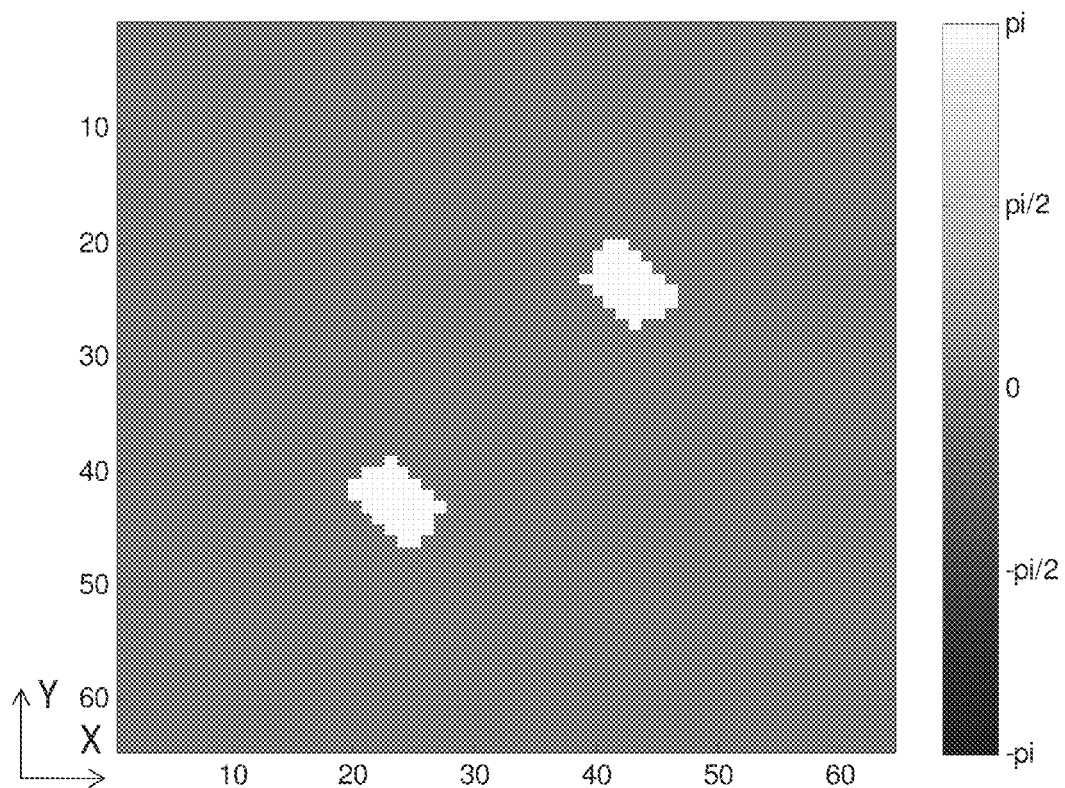

In step S2004, the phase difference between X and Y-polarizations on the predetermined plane is determined. FIG. 9D shows the phase difference under a condition where the incident light is a linearly polarized light and the polarization direction with respect to the X-axis is +45°. The phase difference in the second and fourth quadrant is 0, and the phase difference in the first and third quadrant is π.

In step S2006, phase symmetry between a phase distribution of the X-polarization and a phase distribution of the Y-polarization is determined. FIG. 9E is a more general figure of the phase difference of the target image formed by S-polarization as shown in FIG. 9D. After generating hologram data for X-polarization, hologram data for Y polarization is obtained by flipping the generated hologram data for X polarization along the axis Y=X. FIG. 9F shows one example of phase symmetry for X-polarization under considering the above. FIG. 9G shows phase symmetry for Y-polarization obtained by flipping FIG. 9F. The difference between FIGS. 9F and 9G corresponds to FIG. 9E.

In step S2008, hologram data for X-polarization are generated under an admissibility condition of diffusing the phase of X-polarization while maintaining the phase symmetry shown in FIG. 9F. The above described method can be used to generate the hologram data. In each iterative calculation step, the phase in the overlap region on the predetermined plane might be shifted to maintain the phase symmetry condition. The shift of the phase might be executed so that an amount of shifting the phase becomes smaller. Two possible methods for calculating the diffuser could be a phase-mean method and a complex-amplitude-mean method. The input to both methods is the un-normalized diffuser complex-amplitude coming from the present loop of the diffuser-optimization algorithm. The output is the single diffuser phase that will be forwarded to the next loop. The process continues until the loop terminates. In the phase-mean method, the mean and difference of the two input phases are calculated. If the difference is less than Pi, the mean is used as the output phase. If the difference is greater than Pi, Pi is added to or subtracted from the mean so that the output phase is between −Pi and Pi. In the complex-amplitude-mean method, the diffuser phase is calculated from the mean of the two input complex-amplitudes. The output phase is the phase of the mean complex-amplitude.

Figure 9H:
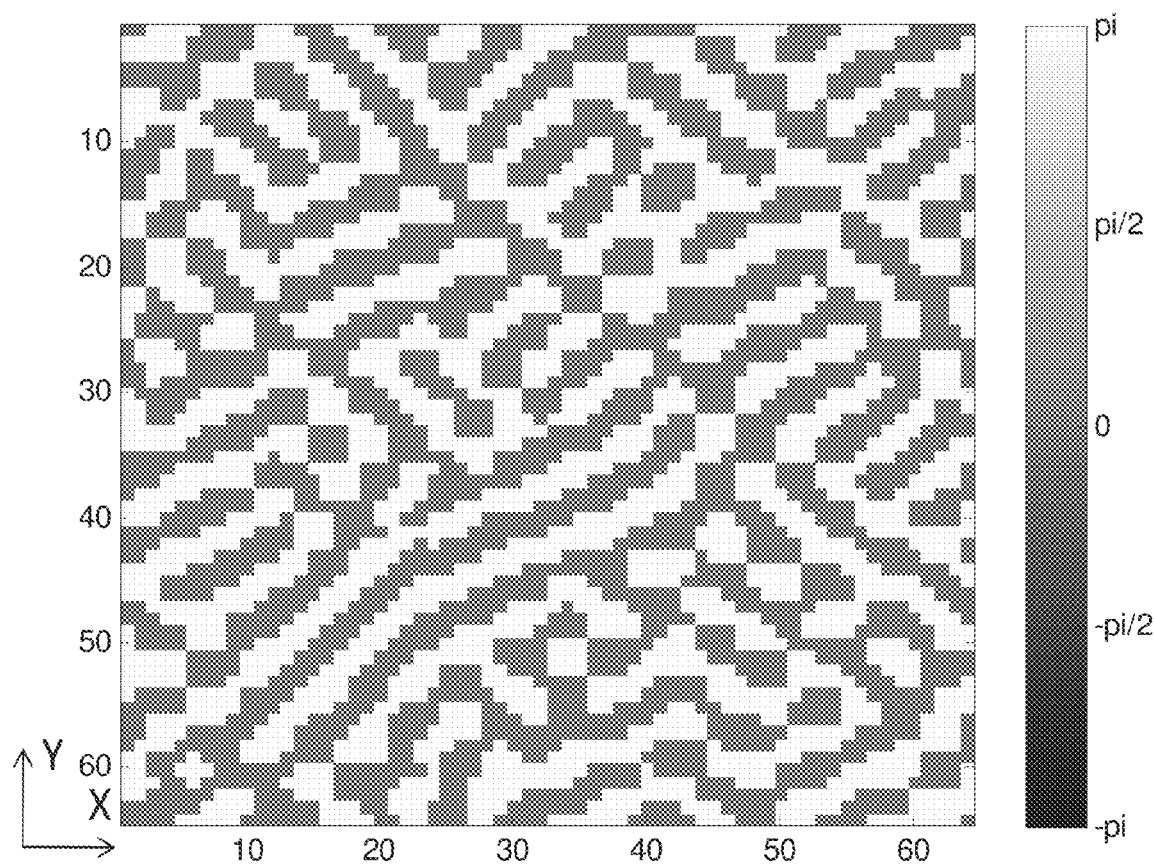
FIGS. 9H and 9I illustrate phase distributions of a computer generated hologram designed for X and Y-polarization, respectively.
Figure 9I:
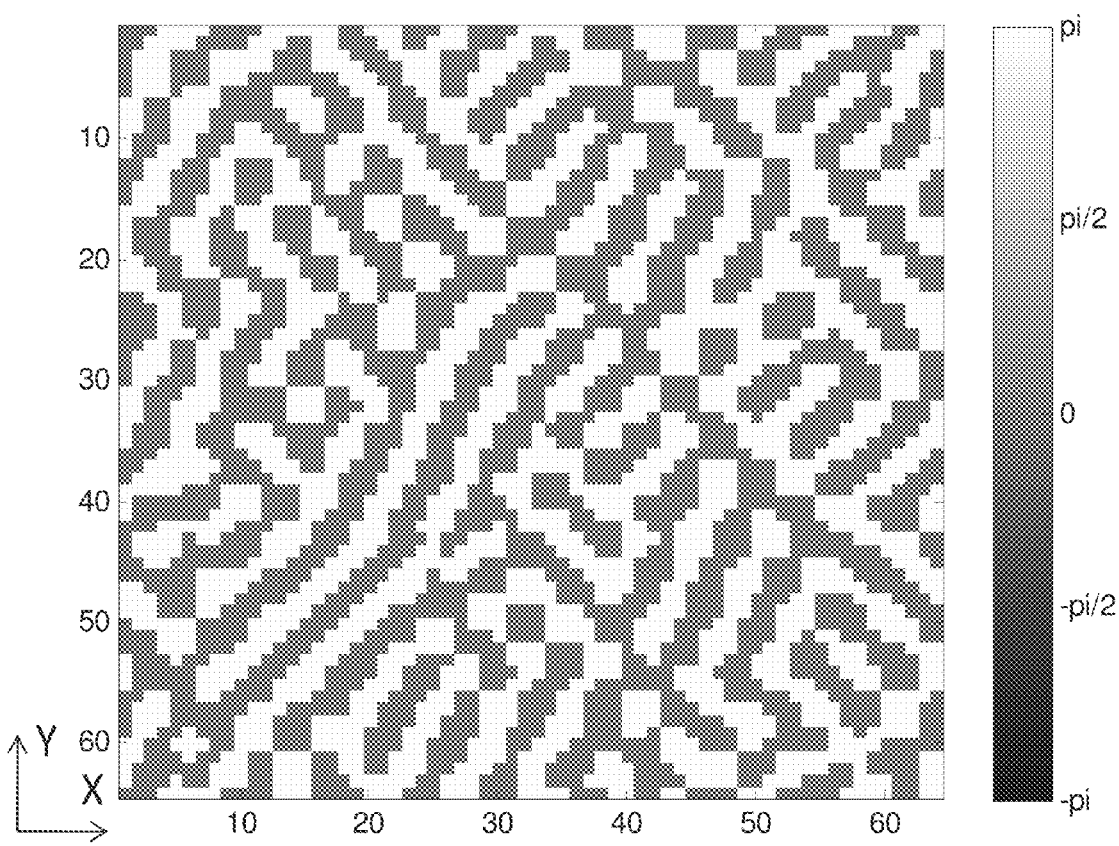
Figure 9J:
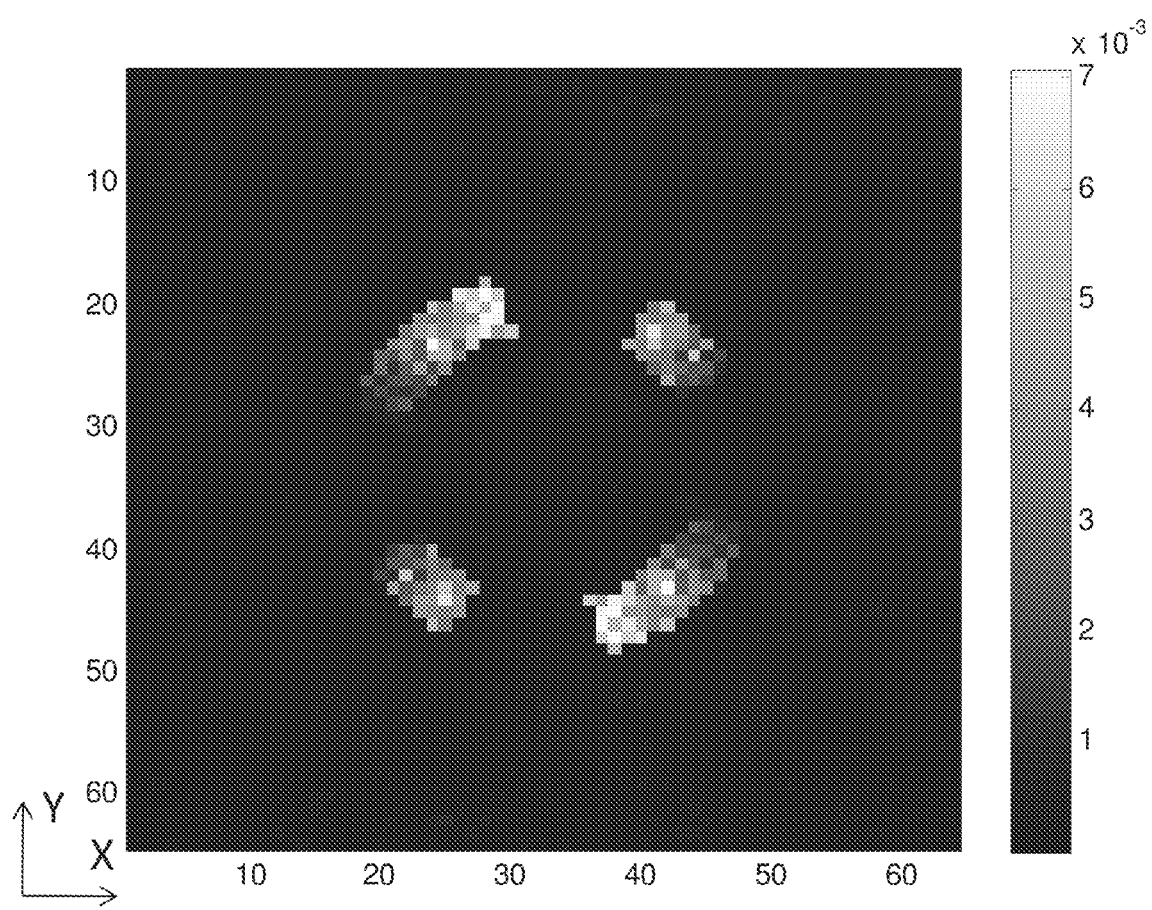
FIGS. 9J and 9K illustrate reconstructed images obtained by using computer generated holograms with the phase distributions shown in FIGS. 9H and 9I, respectively.
Figure 9K:
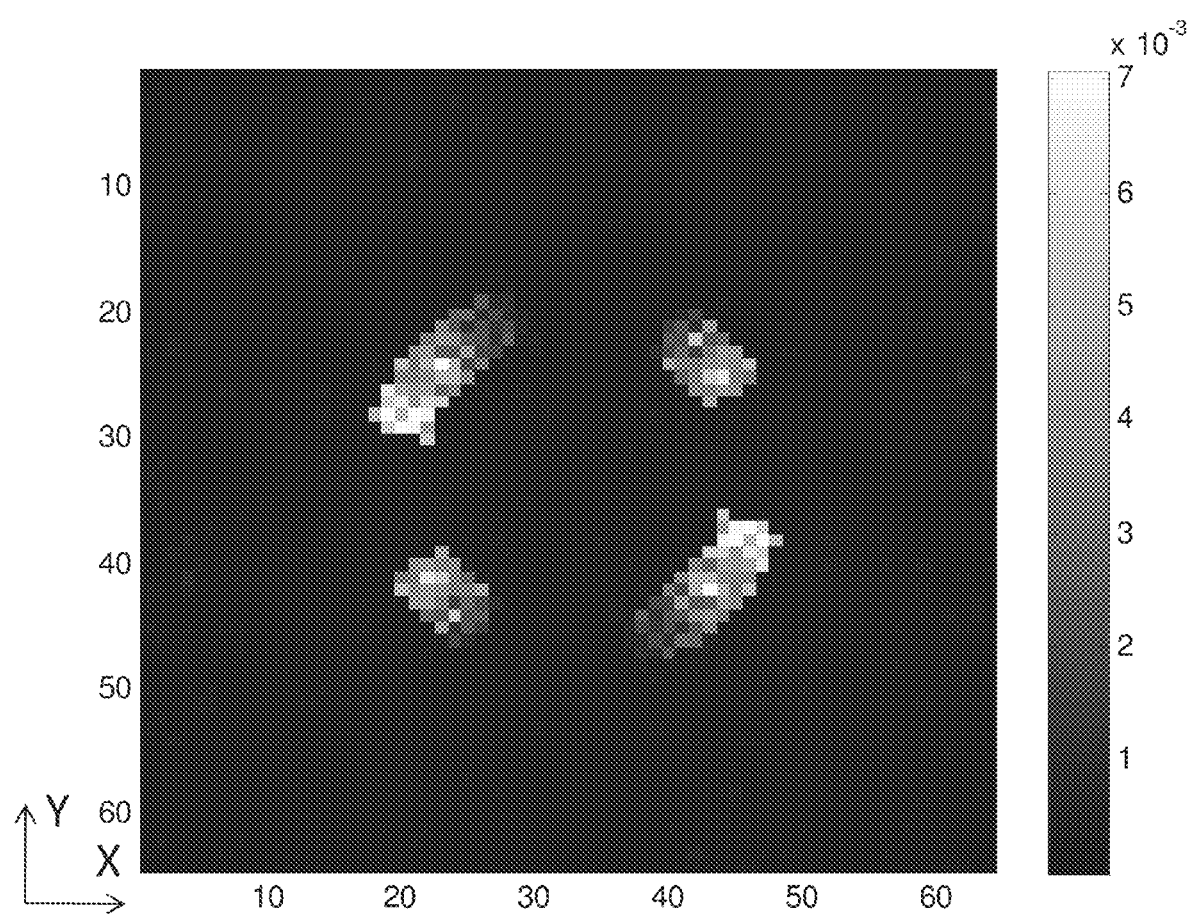
Figure 9L:
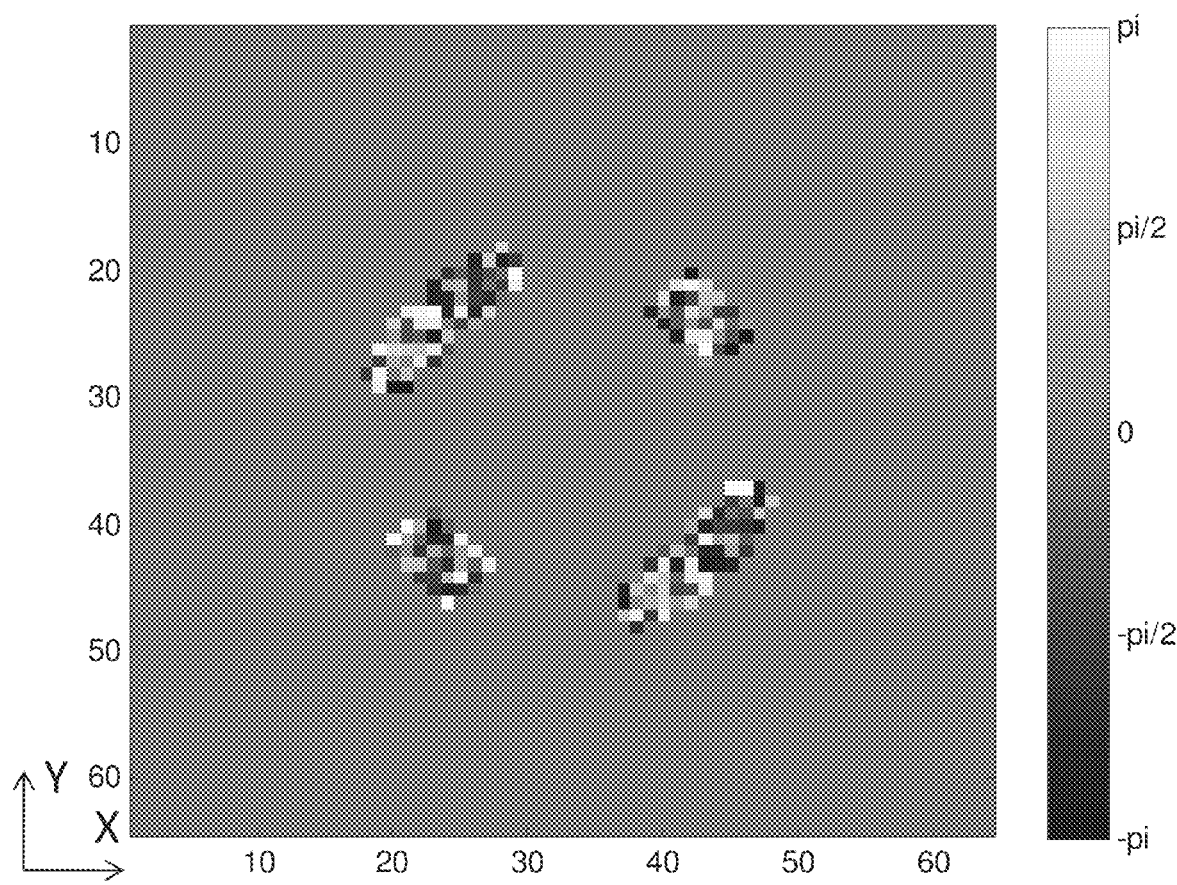
FIGS. 9L and 9M illustrate phase distributions of reconstructed images (FIGS. 9H and 9I), respectively.

FIG. 9H shows one example of generated hologram data for X-polarization. FIG. 9J shows reconstructed images obtained by using generated hologram data (FIG. 9H). FIG. 9J corresponds to the light intensity distribution for X-polarization in shown FIG. 9B. FIG. 9L shows phase distributions for X-polarization on the predetermined plane. The phase distributions are diffused in each portion, each overlap region and the light intensity distribution region for X polarization. FIG. 9L corresponds to the phase symmetry FIG. 9F.

Figure 9M:
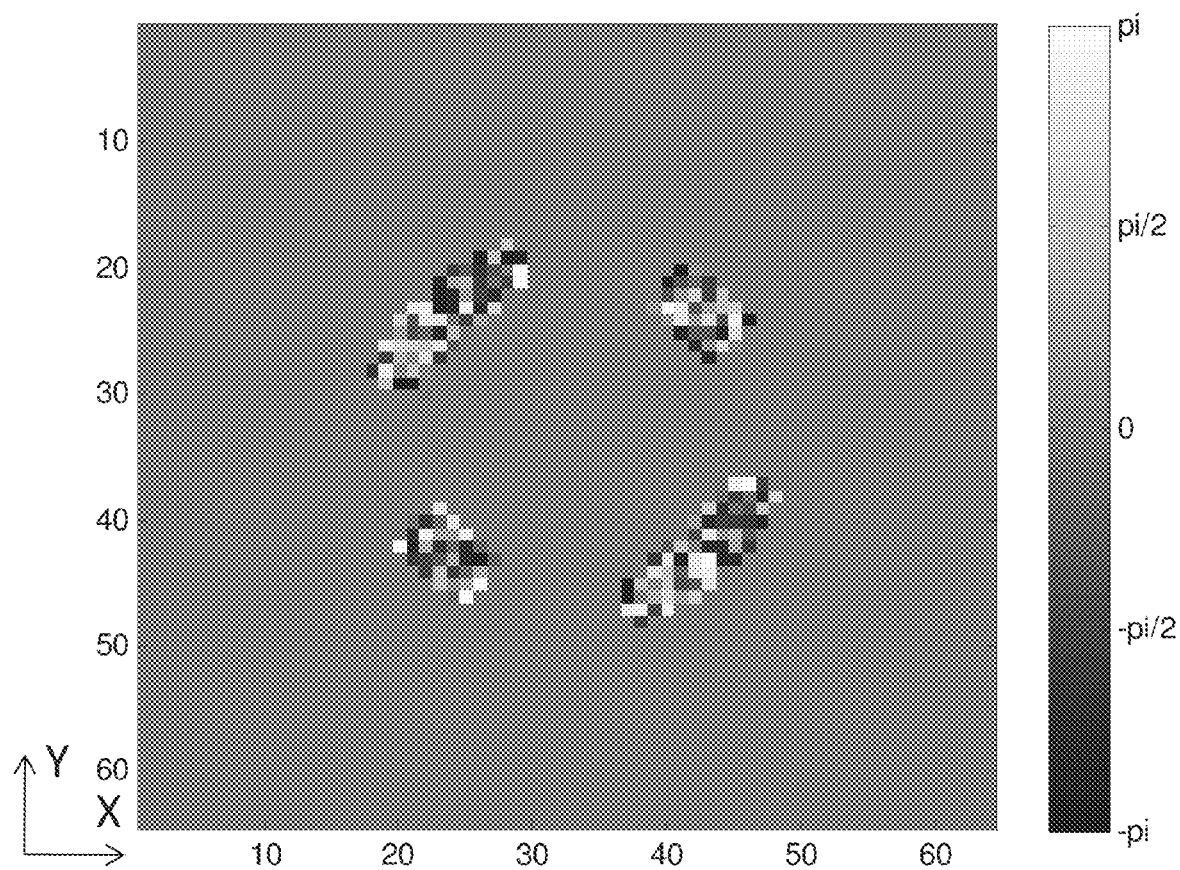
Figure 9N:
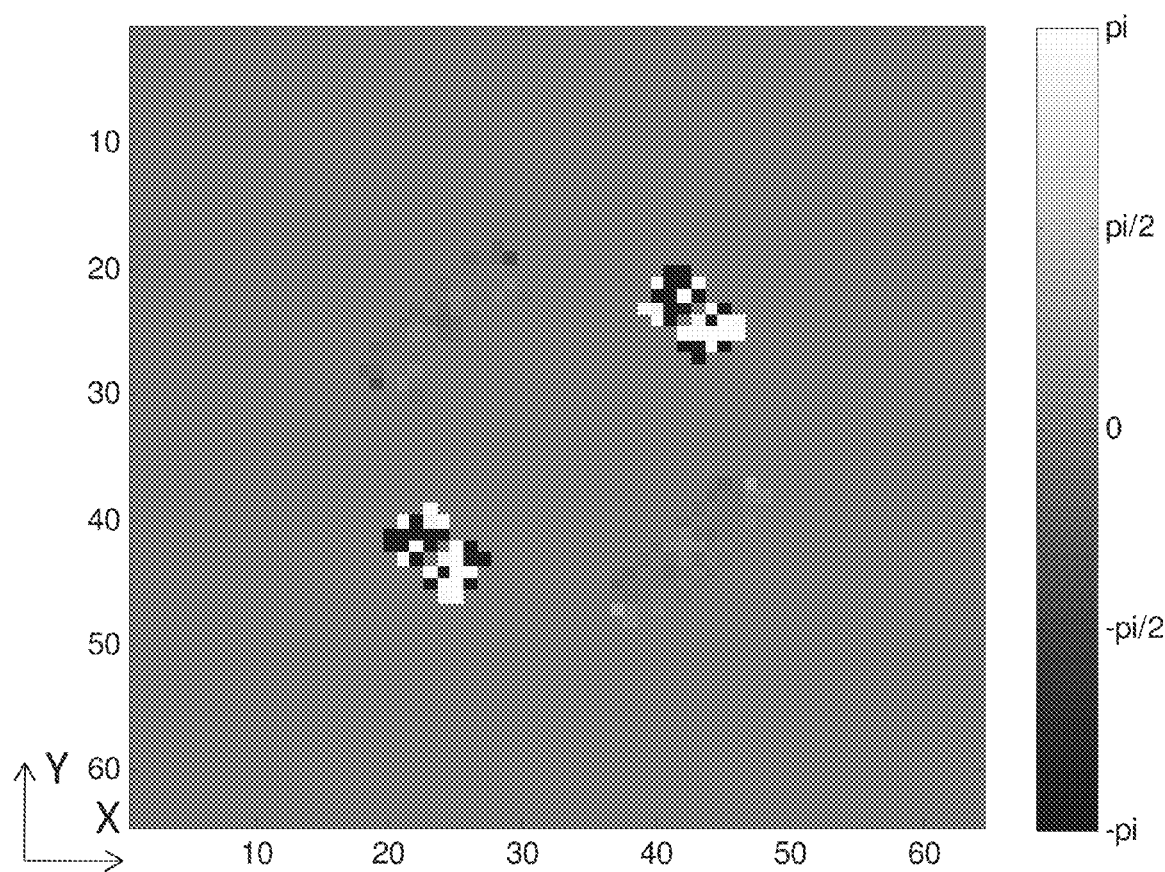
FIG. 9N illustrates a phase difference between FIGS. 9L and 9M.

In step S2010, hologram data for Y-polarization is obtained by flipping the hologram data for X-polarization shown in FIG. 9H. FIG. 9I shows the hologram data for Y-polarization. FIG. 9K shows reconstructed images obtained by using the generated hologram data shown in FIG. 9I. FIG. 9K corresponds to the light intensity distribution for Y-polarization shown in FIG. 9C. FIG. 9M shows phase distributions for Y-polarization on the predetermined plane. FIG. 9N shows the phase difference between X and Y-polarizations on the predetermined plane (9L and 9M). FIG. 9N corresponds to the phase difference between the phases for X- and Y-polarization shown in FIG. 9D.

In step S2012, the hologram data for X and Y-polarizations generated in step S2008 and S2010 shown in FIGS. 9H and 9I are integrated with each other. The above described method can be used to generate the hologram data.

The phase state in the overlap region might be determined on the basis of a light intensity ratio between X and Y-polarizations. It is required to consider speckles for X and Y-polarizations to maintain the light intensity ratio because constructed images obtained by using the generated hologram is formed by speckles. The speckles for X and Y-polarizations might be similar to each other because the hologram data for X and Y-polarizations are symmetric each other. The speckles similar to each other can enhance degree of polarization of the reconstructed image.

In the design method described in the example 2, the light intensity ratio of the target image is always 1:1 because the symmetric axis in the method is y=x. Then, the light intensity ratio of the incident light is also always 1:1. Therefore, a degree of +45° as the polarization direction with respect to the X-axis of the incident light can always available.

Example 3

The case of the light intensity distribution LI including phase distribution is four times rotational symmetric will be explained below. A flowchart shown in FIG. 4 is available for the example 3.

The hologram comprising the plurality of cells can be designed so that a phase distribution of the Y-polarization light intensity distribution is equal to a phase distribution which is realized by rotating a phase distribution of the X-polarization light intensity distribution by an angle of 90 degrees. In other words, the hologram data for Y-polarization can be obtained by rotating the hologram data for X-polarization by an angle of 90 degrees.

FIG. 11A shows the target image which is four times rotational symmetric. This target image is formed by S-polarization.

Figure 10A:
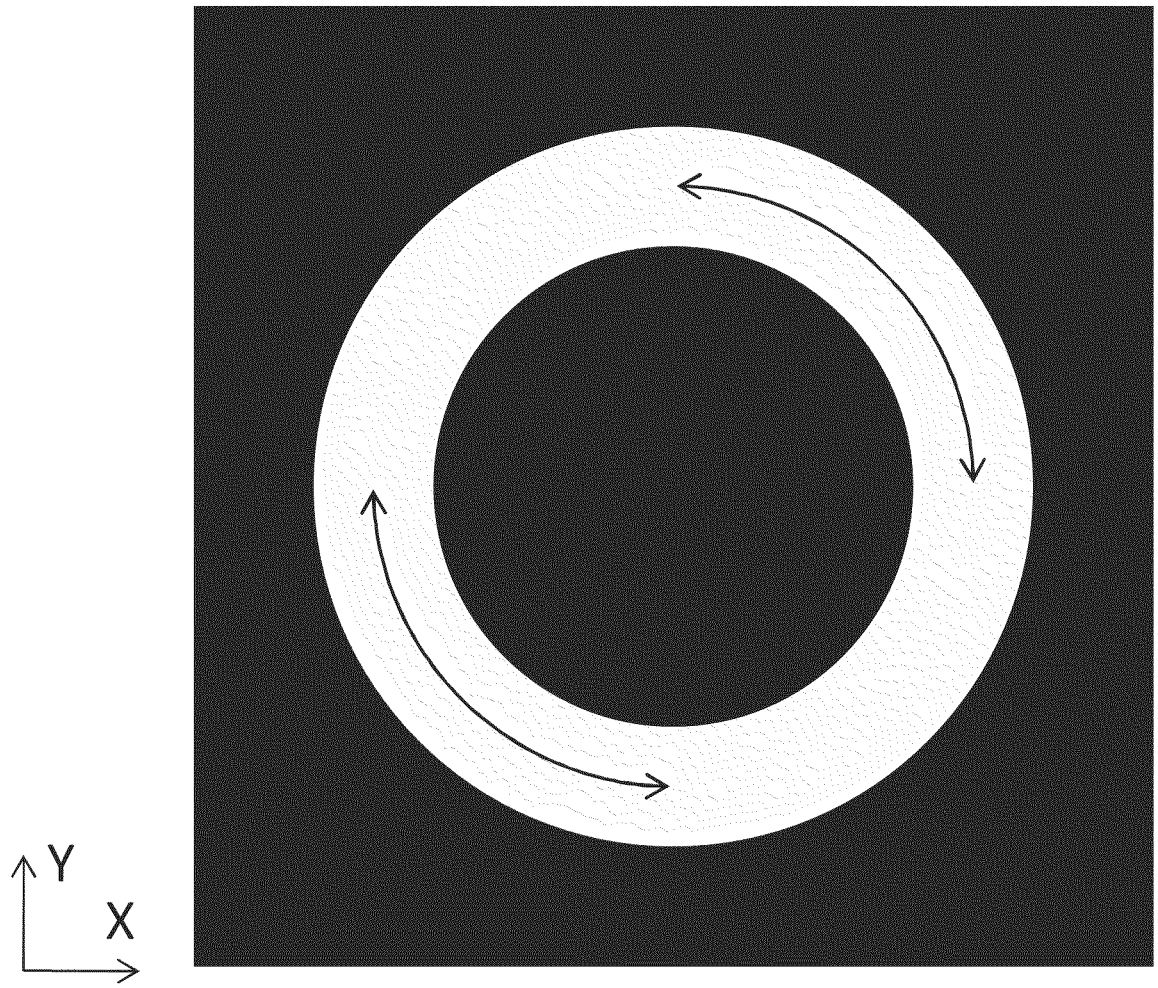
FIG. 10A illustrates an exemplary target image for a computer generated hologram.
Figure 10B:
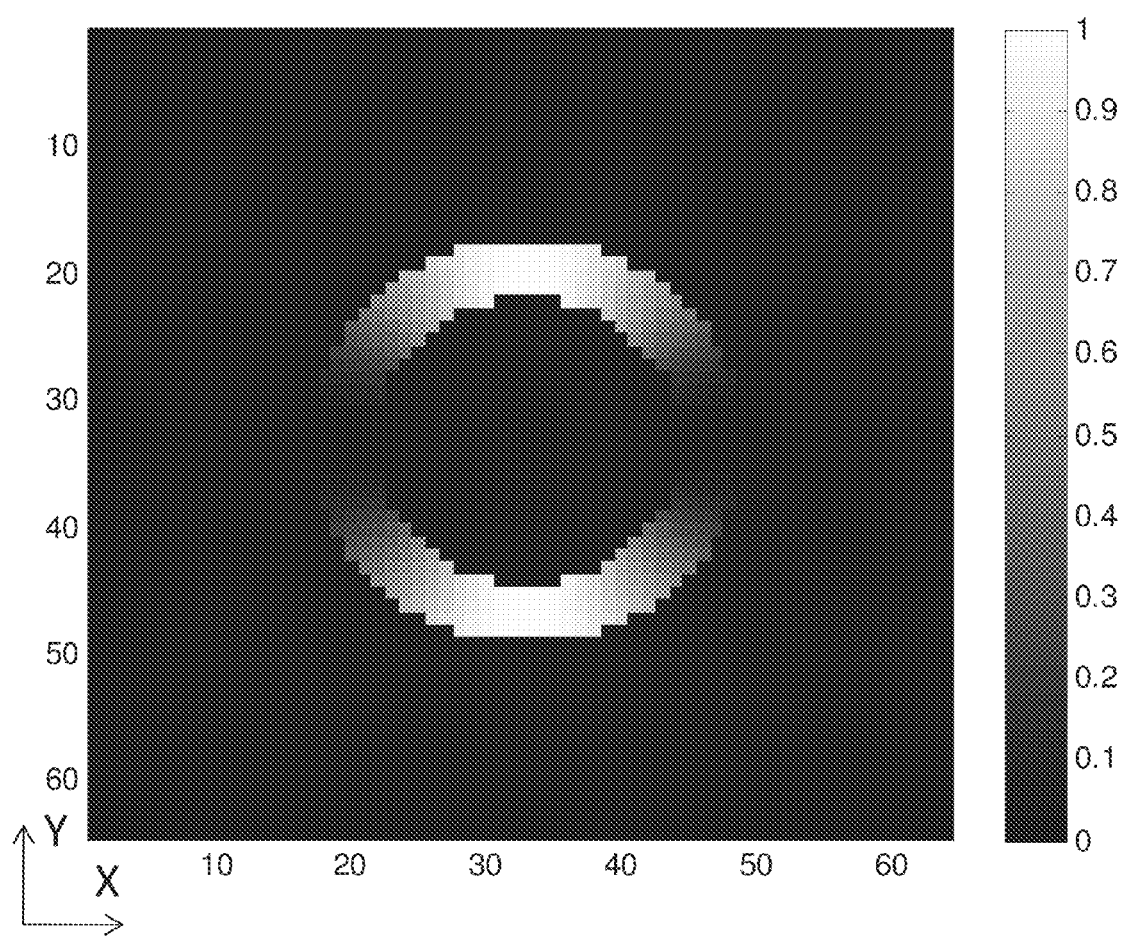
FIGS. 10B and 10C illustrate light intensity distributions divided for X and Y-polarizations, respectively.
Figure 10C:
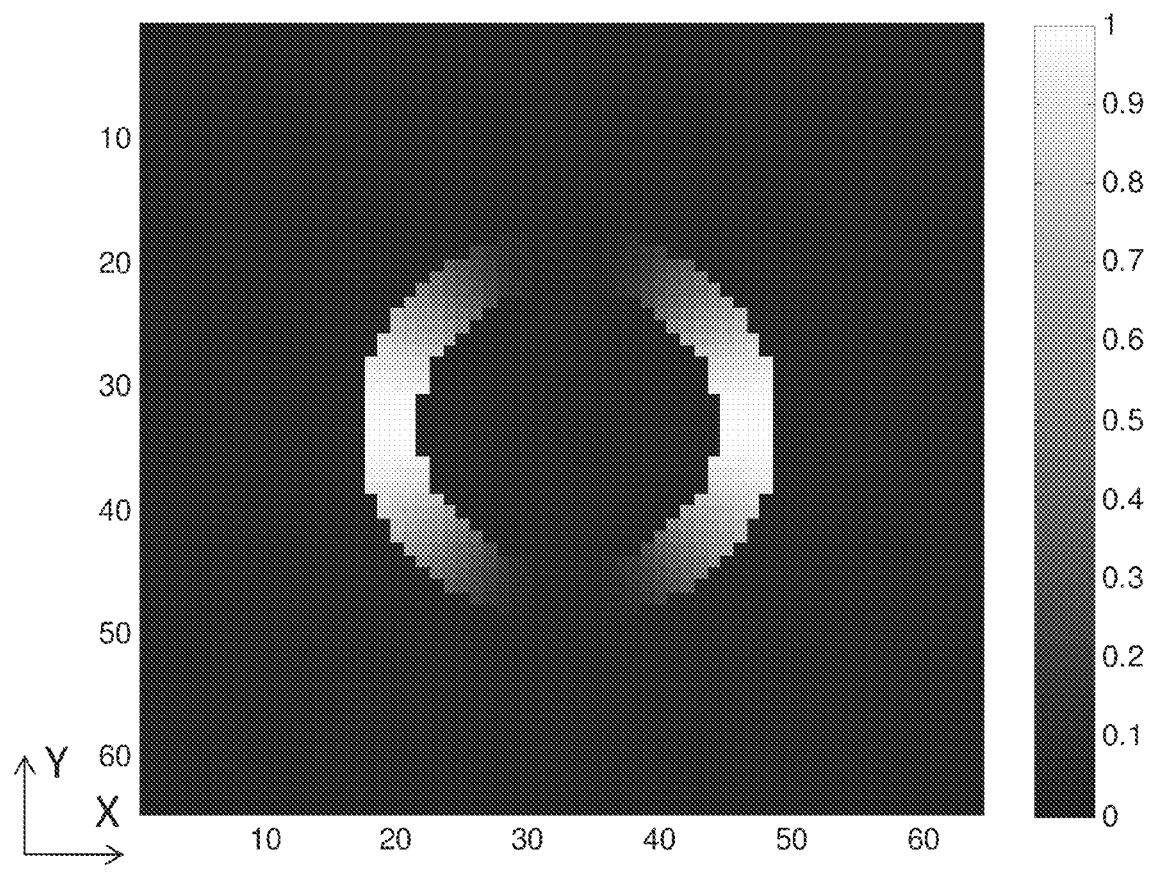

Referring to FIG. 4, in step S2002, the target image is divided into a light intensity distribution formed by X-polarization and another light intensity distribution formed by Y-polarization. FIGS. 10B and 10C show the light intensity distribution divided for X and Y-polarizations, respectively.

Figure 10D:
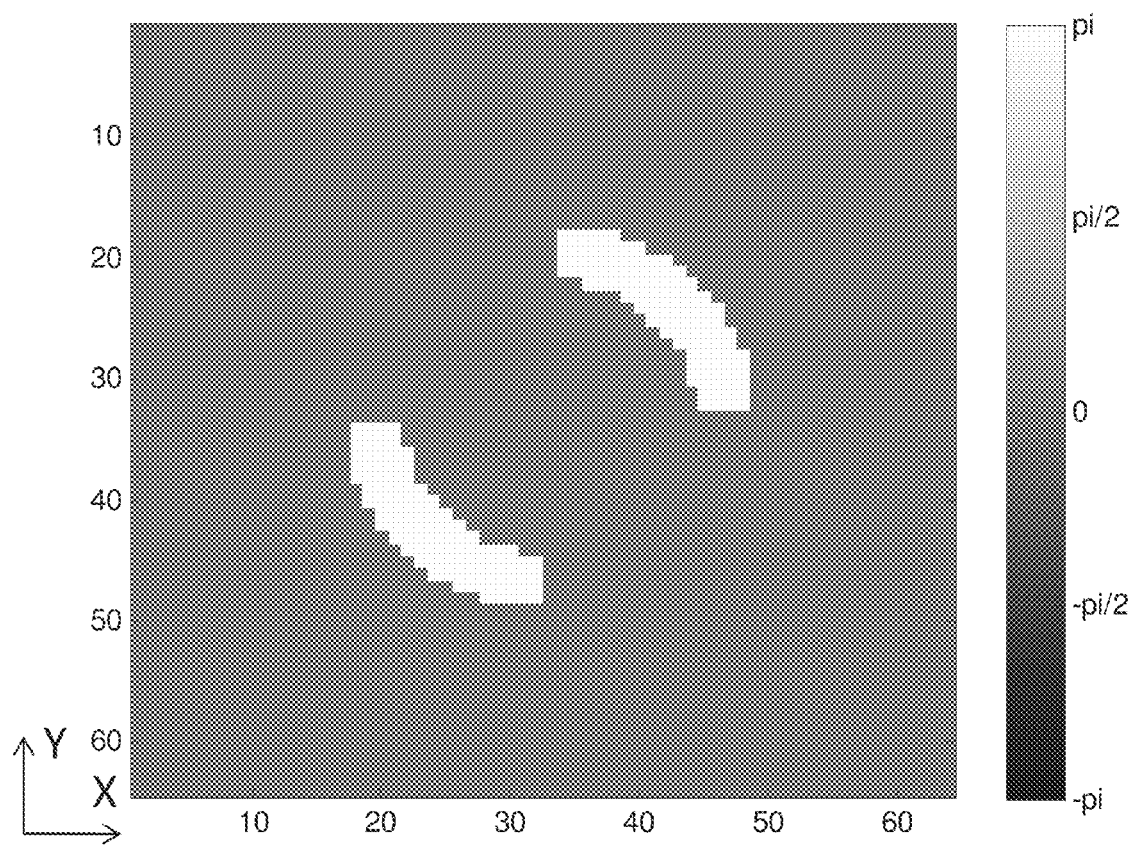

In step S2004, the phase difference between X and Y-polarizations on the predetermined plane is determined. FIG. 10D shows the phase difference under a condition where the incident light is a linearly polarized light and the polarization direction with respect to the X-axis is +45°. The phase difference in the second and fourth quadrant is 0, and the phase difference in the first and third quadrant is π.

In step S2006, phase symmetry between a phase distribution of the X-polarization and a phase distribution of the Y-polarization is determined. FIG. 10E is a more general figure of the phase difference of the target image formed by S-polarization shown in FIG. 10D. After designing hologram data for X-polarization, a hologram data for Y polarization is obtained by rotating the designed hologram data for X polarization by clockwise 90°. FIG. 10F shows one example of phase symmetry for X-polarization with considering the above. FIG. 10G shows phase symmetry for Y-polarization obtained by rotating the phase symmetry shown in FIG. 10F. The difference between FIGS. 10F and 10G corresponds to FIG. 10E.

In step S2008, hologram data for X-polarization are generated under an admissibility condition of diffusing the phase of X-polarization while maintaining the phase symmetry shown in FIG. 10F. To generate the hologram data, above described method will be available. In each iterative calculation step, the phase in the overlap region on the predetermined plane might be shifted to maintain the phase symmetry condition. The shift of the phase might be executed so that an amount of shifting the phase becomes smaller.

Figure 10H:
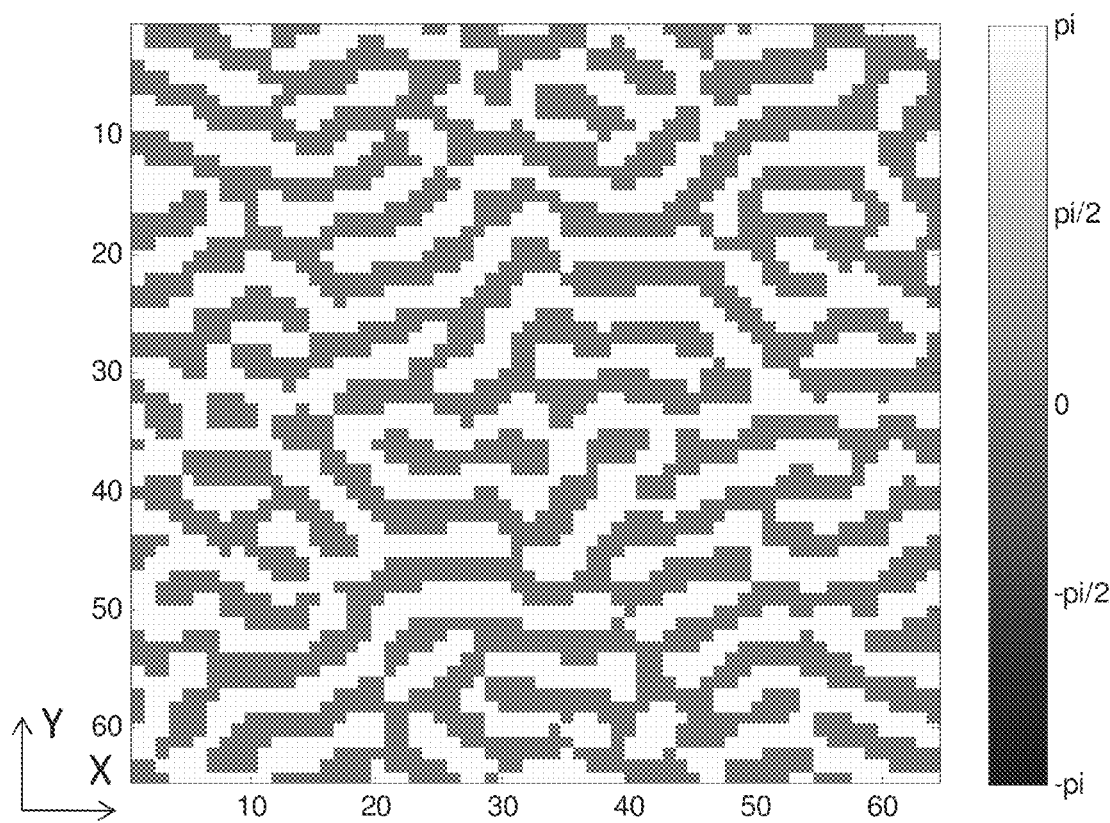
FIGS. 10H and 10I illustrate phase distributions of a computer generated hologram designed for X and Y-polarization, respectively.
Figure 10I:
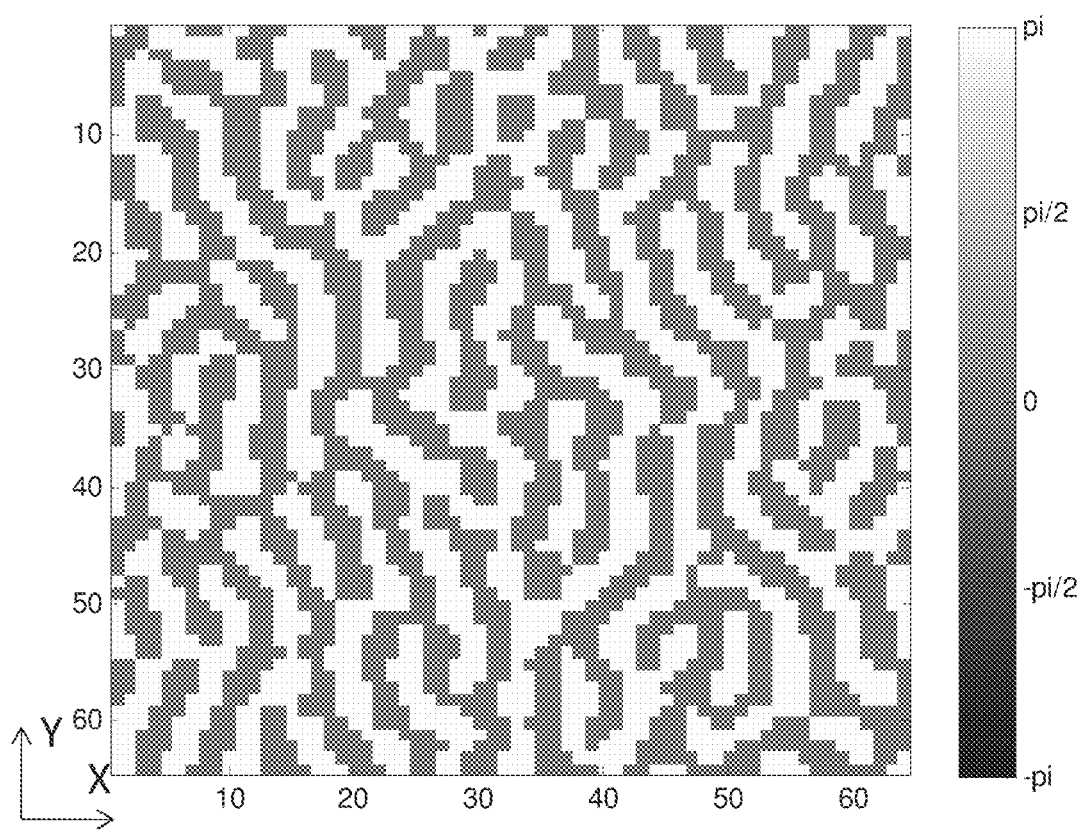
Figure 10J:
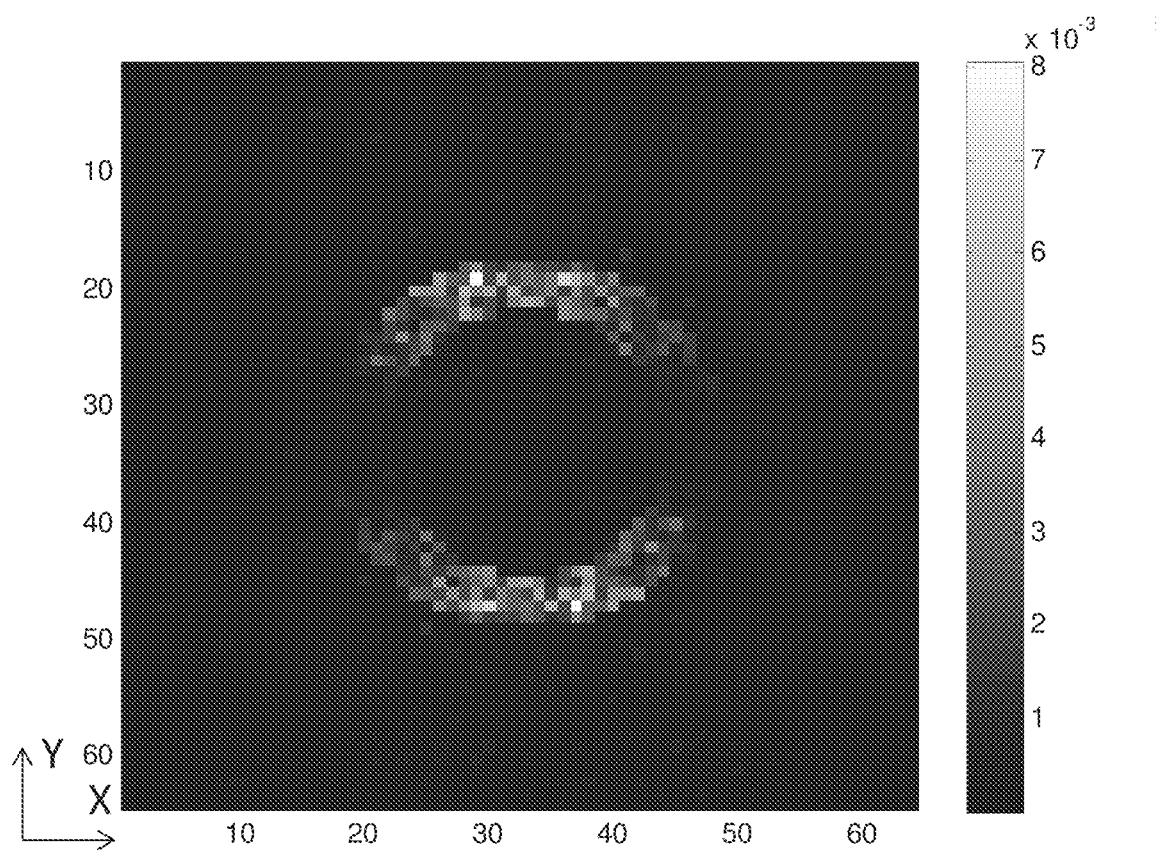
FIGS. 10J and 10K illustrate reconstructed images obtained by using computer generated holograms with the phase distributions shown in FIGS. 10H and 10I, respectively.

FIG. 10H shows one example of generated hologram data for X-polarization. FIG. 10J shows reconstructed images obtained by using the generated hologram data shown in FIG.

Figure 10K:
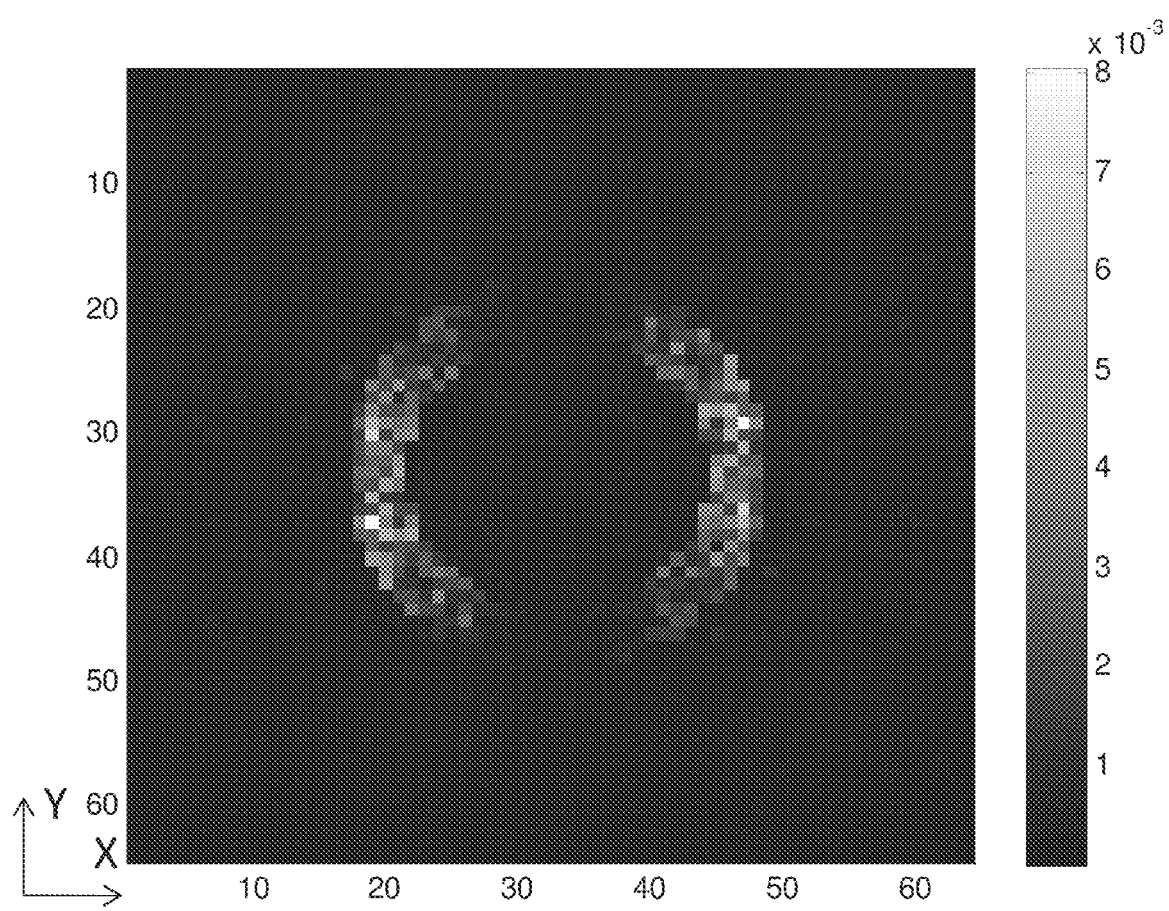
Figure 10L:
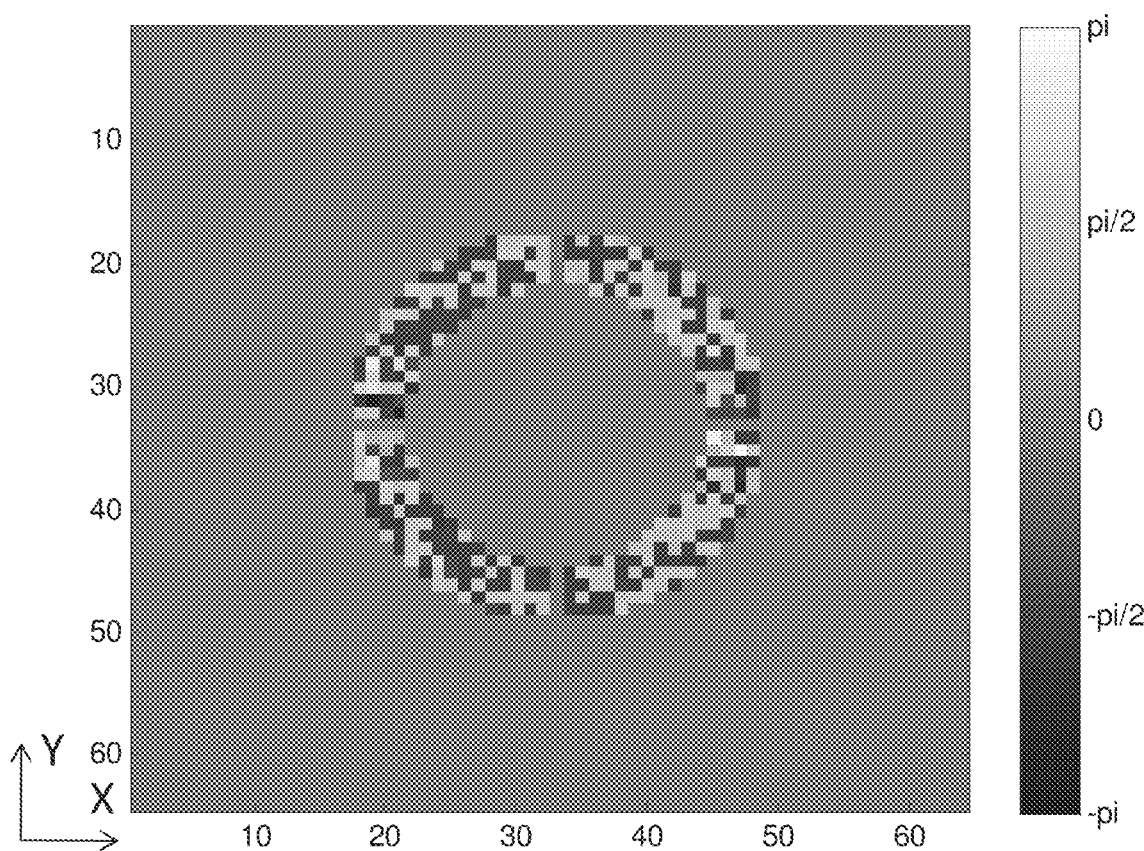
FIGS. 10L and 10M illustrate phase distributions of reconstructed images (FIGS. 10H and 10I), respectively.

10H. FIG. 10J corresponds to the light intensity distribution for X-polarization shown in FIG. 10B. FIG. 10L shows phase distributions for X-polarization on the predetermined plane. The phase distributions are diffused in each portion, in each overlap region and in the light intensity distribution region for X polarization. FIG. 10L corresponds to the phase symmetry shown in FIG. 10F.

Figure 10M:
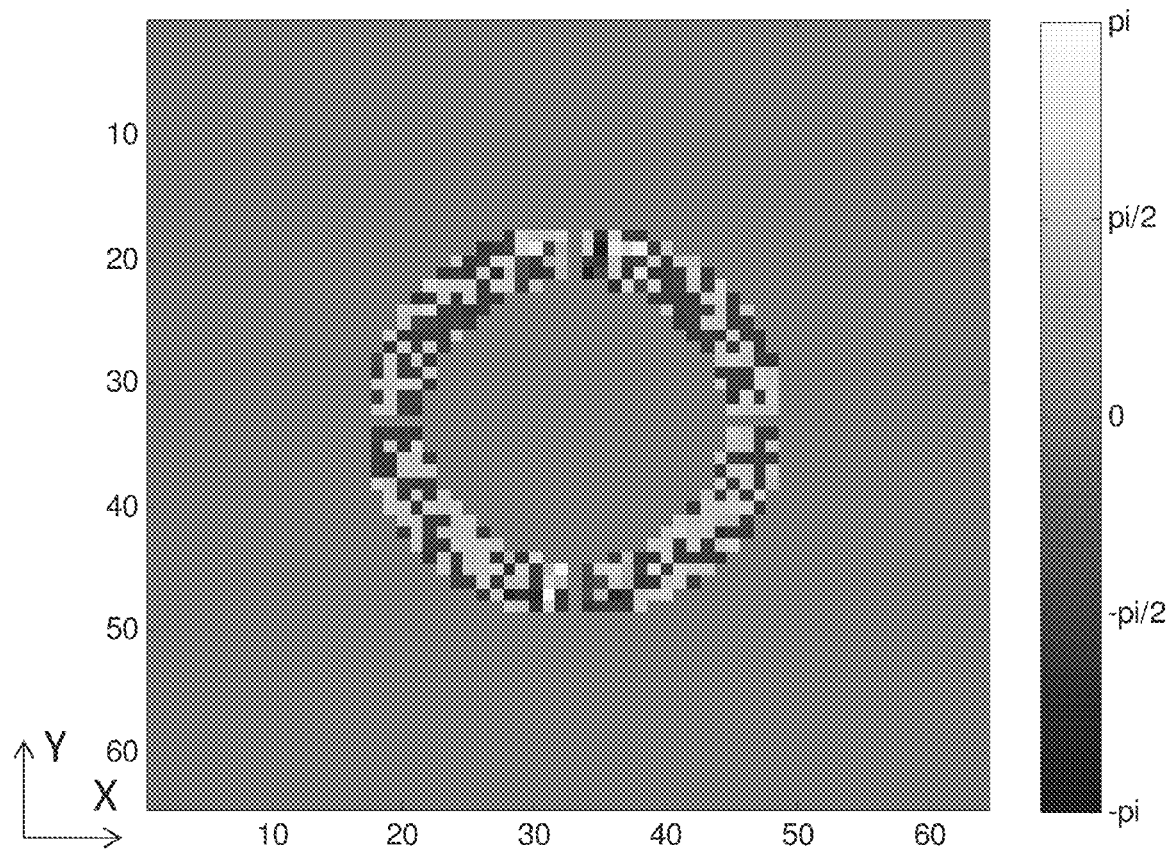
Figure 10N:
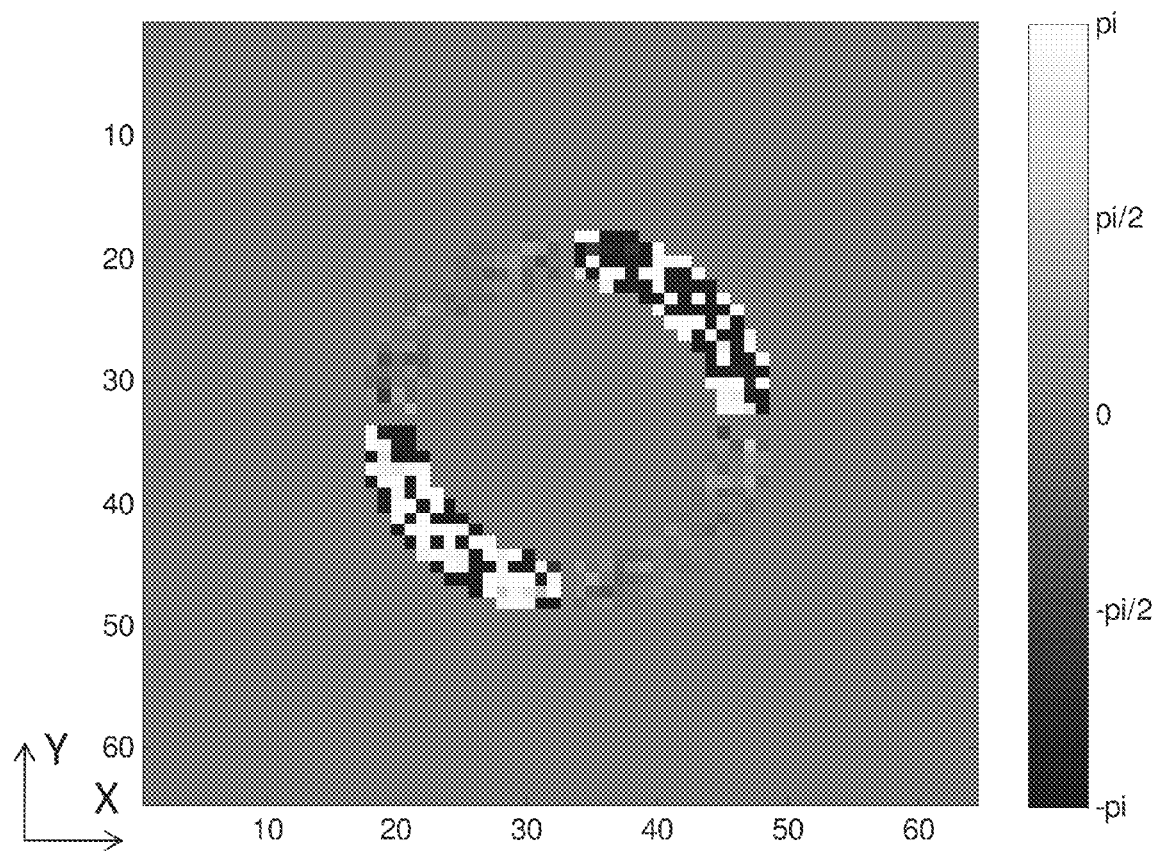
FIG. 10N illustrates a phase difference between FIGS. 10L and 10M.

In step S2010, hologram data for Y-polarization is obtained by rotating the hologram data for X-polarization shown in FIG. 10H according to information of the symmetry. FIG. 10I shows the hologram data for Y-polarization. FIG. 10K shows reconstructed images obtained by using the generated hologram data shown in FIG. 10I. FIG. 10K corresponds to the light intensity distribution for Y-polarization shown in FIG. 10C. FIG. 10M shows phase distributions for Y-polarization on the predetermined plane. FIG. 10N shows the phase difference between X and Y-polarizations on the predetermined plane shown in FIGS. 10L and 10M. It is understood that FIG. 10N corresponds to the phase difference FIG. 10D.

In step S2012, the hologram data for X and Y-polarizations generated in FIGS. 10H and 10I in step S2008 and S2010 are integrated with each other. To generate the hologram data, above described method will be available.

In the examples regarding symmetric targets, the described targets comprise only S-polarization, but target images might comprise not only S-polarization but also circularly polarized light and so on. In this case, phase symmetry on the predetermined plane is different from the phase symmetry shown in FIG. 9F or 10F.

A calculation time by using the symmetric data generating method shown in FIG. 4 might be half of the time by using the general data generating method shown in FIG. 3 because second hologram data will be obtained by using the symmetric data after the first hologram data is generated.

The hologram may be also optionally generated with the flowchart shown in FIG. 3 even when the required target image is symmetric.

In the above described examples, the design method for the target images whose portions in the overlap region MA formed by a linear polarization of which has a polarization direction different from the X and Y-polarizations or a circular polarization is explained. The target image may also optionally comprise an elliptic polarization. In this case, the phase difference to form a required target image on the predetermined plane PS may be selected from a value which is different from 0, $\pi/2$, $\pi$ and $-\pi/2$.

Because the conventional arts require separated CGHs of types in a number equal to that of polarization directions of the target image, it might not be easy for the conventional arts to continuously change the polarization direction in each pixel. In contrast, this embodiment according to the present invention can provide a computer generated hologram which can continuously change the polarization direction in each pixel, as described above.

Although this embodiment has exemplified a case in which the computer generated hologram includes few cells, a light intensity distribution with a desired shape and polarization state can be formed even by increasing the number of cells of the computer generated hologram. Increasing the number of cells of the computer generated hologram may make it possible to decrease the sizes of pixels which divide the light intensity distribution (target image), thus forming a uniform light intensity distribution.

Example 4

Figure 11:
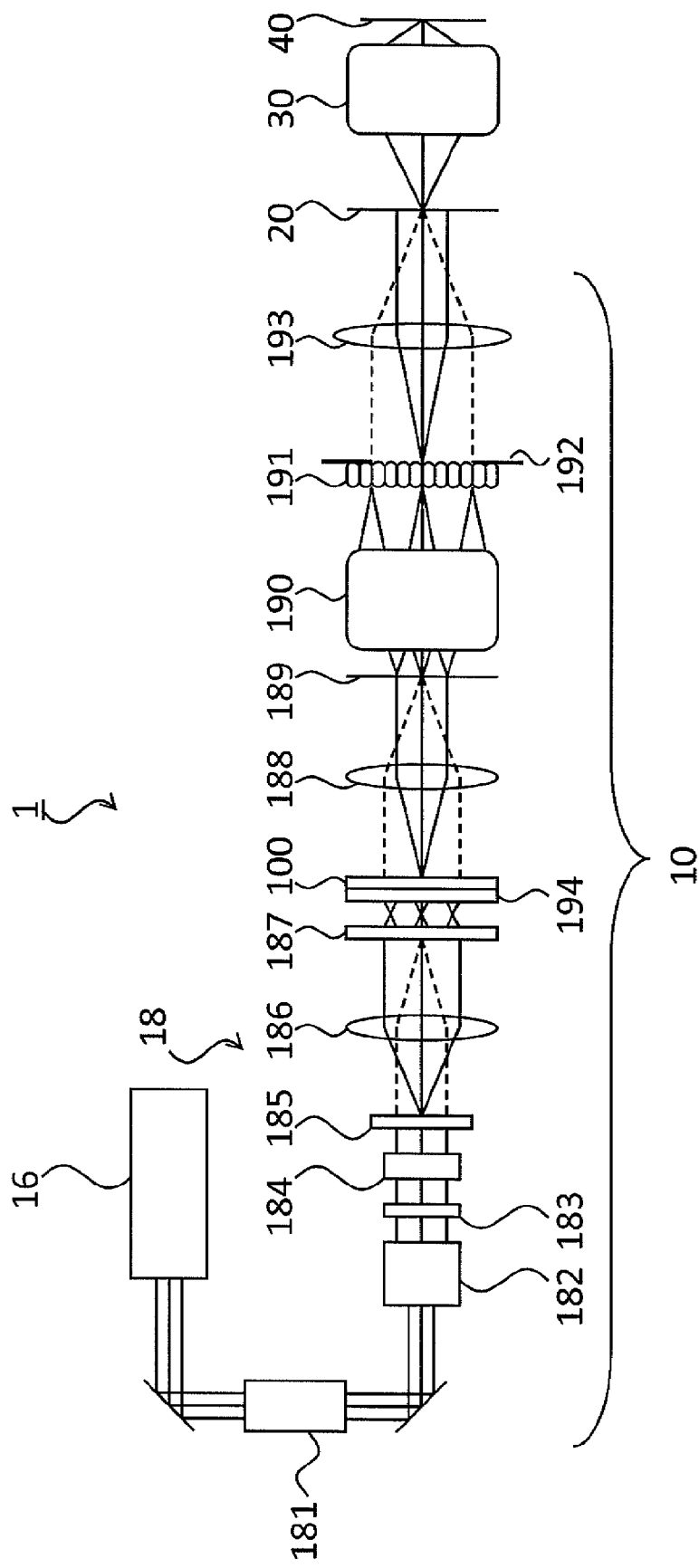
FIG. 11 illustrates the arrangement of an exposure apparatus according to one aspect of the present invention.

An exposure apparatus 1 to which the hologram 100 is applied will be explained below with reference to FIG. 11. FIG. 11 illustrates an exemplary arrangement of the exposure apparatus 1.

The exposure apparatus 1 is a projection exposure apparatus which transfers the pattern of a reticle 20 onto a wafer 40 by the step & scan scheme. However, the exposure apparatus 1 can adopt the step & repeat scheme or another exposure scheme.

As shown in FIG. 11, the exposure apparatus 1 includes an illumination apparatus 10, a reticle stage (not shown) for supporting the reticle 20, a projection optical system 30, and a wafer stage (not shown) for supporting the wafer 40.

The illumination apparatus 10 illuminates the reticle 20 on which a circuit pattern to be transferred is formed, and includes a light source 16 and illumination optical system 18.

The light source 16 is, for example, an excimer laser such as an ArF excimer laser with a wavelength of about 193 nm or a KrF excimer laser with a wavelength of about 248 nm. However, the light source 16 is not particularly limited to an excimer laser, and may be, for example, an $F_2$ laser with a wavelength of about 157 nm or a mercury lamp with a narrow wavelength range.

The illumination optical system 18 illuminates the reticle 20 with light from the light source 16, and performs modified illumination on the reticle 20 in a predetermined polarization state while ensuring a predetermined illuminance. In this example, the illumination optical system 18 includes a light extension optical system 181, beam shaping optical system 182, polarization controller 183, phase controller 184, exit angle saving optical element 185, relay optical system 186, multibeam generation unit 187, polarization state adjusting unit 194, and the hologram 100. The illumination optical system 18 also includes a relay optical system 188, aperture 189, zoom optical system 190, multibeam generation unit 191, aperture stop 192, and irradiation unit 193.

The light extension optical system 181 deflects light from the light source 16 to guide it to the beam shaping optical system 182. The beam shaping optical system 182 shapes the section of the light from the light source 16 into a desired shape by converting the horizontal to vertical ratio of the section of the light from the light source 16 into a desired value (e.g., by changing the sectional shape from a rectangle to a square). The beam shaping optical system 182 forms a light beam with a size and an angle of divergence which are required to illuminate the multibeam generation unit 187.

The polarization controller 183 includes, for example, a linear polarizer and has a function of removing unnecessary polarized light components. It is possible to efficiently convert light from the light source 16 into desired linearly polarized light by minimizing polarized light components removed (shielded) by the polarization controller 183.

The phase controller 184 converts the linearly polarized light obtained by the polarization controller 183 into circularly polarized light by giving a phase difference of $\lambda/4$ to it.

The exit angle saving optical element 185 includes, for example, an optical integrator (e.g., a fly-eye lens or fiber bundle including a plurality of microlenses), and outputs the light at a predetermined angle of divergence.

The relay optical system 186 converges the light which emerges from the exit angle saving optical element 185 on the multibeam generation unit 187. The relay optical system 186 adjusts the exit surface of the exit angle saving optical element 185 and the incident surface of the multibeam generation unit 187 to hold the Fourier transform relationship (the relationship between the object plane and the pupil plane or that between the pupil plane and the image plane).

The multibeam generation unit 187 includes an optical integrator (e.g., a fly-eye lens or fiber bundle including a plurality of microlenses) for uniformly illuminating the polarization state adjusting unit 194 and computer generated hologram 100. The exit surface of the multibeam generation unit 187 forms a light source surface including a plurality of point light sources. The light which emerges from the multibeam generation unit 187 impinges on the polarization state adjusting unit 194 as circularly polarized light.

The polarization state adjusting unit 194 converts the circularly polarized light obtained by the phase controller 184 into linearly polarized light having a desired polarization direction by giving a phase difference of λ/4 to it. The light which emerges from the polarization state adjusting unit 194 impinges on the computer generated hologram 100 as linearly polarized light.

More specifically, in one example, the incident light generated from the light source 16 might include X and Y-polarizations, and an amplitude of X-polarization might be equal to an amplitude of Y-polarization.

The hologram 100 forms a light intensity distribution (e.g., a light intensity distribution LI as shown in FIG. 1) at the position of the aperture 189 via the relay optical system 188. The hologram 100 can take any of the above-described forms, and a detailed description thereof will not be given here.

The aperture 189 has a function of passing only a light intensity distribution formed by the hologram 100. The computer generated hologram 100 and aperture 189 are set to hold the Fourier transform relationship.

The zoom optical system 190 enlarges a light intensity distribution formed by the hologram 100 at a predetermined magnification, and projects it onto the multibeam generation unit 191.

The multibeam generation unit 191 is inserted on the pupil plane of the illumination optical system 18, and forms, on its exit surface, a light source image (effective light source distribution) corresponding to the light intensity distribution formed at the position of the aperture 189. In this example, the multibeam generation unit 191 includes an optical integrator such as a fly-eye lens or cylindrical lens array. The aperture stop 192 is inserted near the exit surface of the multibeam generation unit 191.

The irradiation unit 193 includes, for example, a condenser optical system and illuminates the reticle 20 with an effective light source distribution formed on the exit surface of the multibeam generation unit 191.

The reticle 20 has a circuit pattern and is supported and driven by the reticle stage (not shown). Diffracted light generated by the reticle 20 is projected onto the wafer 40 via the projection optical system 30. Since the exposure apparatus 1 is of the step & scan scheme, it transfers the pattern of the reticle 20 onto the wafer 40 by scanning them.

The projection optical system 30 projects the pattern of the reticle 20 onto the wafer 40. The projection optical system 30 can be a dioptric system, catadioptric system, or catoptric system.

The wafer 40 is a substrate onto which the pattern of the reticle 20 is projected (transferred), and is supported and driven by the wafer stage (not shown). However, it is also possible to use a glass plate or another substrate in place of the wafer 40. The wafer 40 is coated with a resist.

As described above, the computer generated hologram 100 does not give a phase distribution to the wavefront of light polarized in a single direction, but two-dimensionally gives different phase distributions to the wavefronts of both X-polarization and Y-polarization. This makes it possible to form a light intensity distribution LI almost without generating any loss in light amount.

In exposure, light emitted by the light source 16 illuminates the reticle 20 by the illumination optical system 18. The light which bears the information of the pattern of the reticle 20 forms an image on the wafer 40 by the projection optical system 30. The illumination optical system 18 used for the exposure apparatus 1 can suppress any illumination variation and loss in light amount, and form a light intensity distribution with a desired shape and polarization state by the hologram 100. Hence, the exposure apparatus 1 can provide high-quality devices (e.g., a semiconductor device, an LCD device, an image sensing device (e.g., a CCD), and a thin-film magnetic head) with a high throughput and a good economical efficiency.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A hologram which forms a light intensity distribution and a light polarization distribution on a predetermined plane by using incident light, the hologram comprising:
   a plurality of cells configured to control both a phase of a first polarized light component in a first polarization direction of the incident light, and a phase of a second polarized light component in a second polarization direction perpendicular to the first polarization direction,
   wherein the plurality of cells are designed to form a portion, where both the first polarized light component and the second polarized light component enter, in an overlap region in which a first light intensity distribution region formed on the predetermined plane by the first polarized light component and a second light intensity distribution region formed on the predetermined plane by the second polarized light component are overlapped on each other, and
   wherein a polarized light in the portion has a different polarization state from the incident light of the individual first and second polarized light components,
   a phase difference between the phase of the first polarized light component and the phase of the second polarized light component is a constant value in the portion, and
   the phase of the first polarized light component is diffused in the portion.

2. The hologram according to claim 1, wherein the plurality of cells are designed so that a phase distribution of the second light intensity distribution is equal to a phase distribution which is realized by flipping a phase distribution of the first light intensity distribution along an axis of y=x or y=−x, wherein x represents the first polarization direction of the first polarized light component, and y represents the second polarization direction of the second polarized light component.

3. The hologram according to claim 1, wherein the plurality of cells are designed so that a phase distribution of the second light intensity distribution is equal to a phase distribution which is realized by rotating a phase distribution of the first light intensity distribution by an angle of 90 degrees.

4. The hologram according to claim 1, wherein the phase of the first polarized light component is diffused in the overlap region.

5. The hologram according to claim 1, wherein the phase of the first polarized light component is diffused in the first intensity distribution region.

6. The hologram according to claim 1, wherein another portion which has another phase difference, between the phase of the first polarized light component and the phase of the second polarized light component, different from the phase difference in the portion is in the overlap region.

7. The hologram according to claim 1, wherein the constant value is selected from 0, $\pi/2$, $\pi$ and $-\pi/2$.

8. The hologram according to claim 1, wherein the plurality of cells comprise an anisotropic cell which has an anisotropic medium configured to change a polarization state of the incident light.

9. The hologram according to claim 8, wherein the anisotropic medium includes at least one of a birefringent material and a three-dimensional structure which generates form birefringence.

10. The hologram according to claim 1, wherein the plurality of cells comprise anisotropic cells including an anisotropic medium configured to change a polarization state of the incident light, and isotropic cells including an isotropic medium configured not to change a polarization state of the incident light.

11. The hologram according to claim 1, wherein the polarization state different from the first and second polarized light components is selected from a linear polarization which has a polarization direction different from the first and second polarized light components, a circular polarization, and an elliptic polarization.

12. The hologram according to claim 1, wherein the hologram is a computer generated hologram.

13. An exposure apparatus comprising:
an illumination optical system configured to illuminate a reticle with a light source, the illumination optical system including a hologram which forms a light intensity distribution and a light polarization distribution on a predetermined plane by using an incident light generated from the light source; and
a projection optical system configured to project a pattern of the reticle onto a substrate,
wherein the hologram comprises a plurality of cells configured to control both a phase of a first polarized light component, in a first polarization direction, of the incident light and a phase of a second polarized light component in a second polarization direction perpendicular to the first polarization direction,
the plurality of cells are designed to form a portion, where both the first polarized light component and the second polarized light component enter, in an overlap region in which a first light intensity distribution region formed on the predetermined plane by the first polarized light component and a second light intensity distribution region formed on the predetermined plane by the second polarized light component are overlapped on each other,
wherein a polarized light in the portion has a different polarization state from the incident light of the individual first and second polarized light components,
a phase difference between the phase of the first polarized light component and the phase of the second polarized light component is a constant value in the portion, and
the phase of the first polarized light component is diffused in the portion.

14. The exposure apparatus according to claim 13, wherein the incident light generated from the light source includes the first and second polarized light components, and an amplitude of the first polarized light component is equal to an amplitude of the second polarized light component.

15. A hologram data generation method used to manufacture a computer generated hologram which forms a light intensity distribution and a light polarization distribution on a predetermined plane by using an incident light, the hologram data generation method comprising:
dividing the light intensity distribution to be formed on the predetermined plane into a first light intensity distribution formed by a first polarized light component in a first polarization direction, and a second light intensity distribution formed by a second polarized light component in a second polarization direction perpendicular to the first polarization direction;
determining a phase difference between a phase of the first polarized light component and a phase of the second polarized light component in accordance with a relationship between a polarization direction of the incident light and a polarization state of the light intensity distribution to be formed on the predetermined plane so that polarized light in a portion has a different polarization state from the incident light of the individual first and second polarized light components is formed where both the first polarized light component and the second polarized light component enter, in an overlap region in which the first light intensity distribution formed on the predetermined plane by the first polarized light component and the second light intensity distribution formed on the predetermined plane by the second polarized light component are overlapped on each other; and
generating a first hologram data to form the first light intensity distribution and a second hologram data to form the second light intensity distribution under an admissibility condition of diffusing the phase of the first polarized light component while maintaining the phase difference; and
integrating the first hologram data and the second hologram data.

16. A hologram data generation method used to manufacture a computer generated hologram which forms a light intensity distribution and a light polarization distribution on a predetermined plane by using an incident light, the hologram data generation method comprising:
dividing the light intensity distribution to be formed on the predetermined plane into a first light intensity distribution formed by a first polarized light component in a first polarization direction, and a second light intensity distribution formed by a second polarized light component in a second polarization direction perpendicular to the first polarization direction;
determining a phase difference between a phase of the first polarized light component in the first light intensity distribution and a phase of the second polarized light component in the second light intensity distribution in accordance with a relationship between a polarization direction of the incident light and a polarization state of the light intensity distribution to be formed on the predetermined plane so that wherein a polarized light in a portion has a different polarization state from the incident light of the individual first and second polarized light components is formed, where both the first polarized light component and the second polarized light component enter, in an overlap region in which the first light intensity distribution formed on the predetermined plane by the first polarized light component and the second light intensity distribution formed on the predetermined plane by the second polarized light component are overlapped on each other;
determining a phase symmetry between a phase distribution of the first polarized light component and a phase distribution of the second polarized light component;
generating a first hologram data to form the first light intensity distribution under an admissibility condition of diffusing the phase of the first polarized light component while maintaining the phase difference;

generating a second hologram data to form the second light intensity distribution using information of the phase symmetry and the first hologram data; and integrating the first hologram data and the second hologram data.

* * * * *

UNITED STATES PATENT AND TRADEMARK OFFICE
CERTIFICATE OF CORRECTION

PATENT NO. : 8,531,747 B2
APPLICATION NO. : 12/491094
DATED : September 10, 2013
INVENTOR(S) : Isao Matsubara et al.

Page 1 of 1

It is certified that error appears in the above-identified patent and that said Letters Patent is hereby corrected as shown below:

On The Title Page, Item (73) Assignee should read
-- Canon Kabushiki Kaisha; and
The Arizona Board of Regents on Behalf of the University of Arizona --

Signed and Sealed this
Third Day of May, 2016

Michelle K. Lee
*Director of the United States Patent and Trademark Office*